(12) United States Patent
May et al.

(10) Patent No.: US 12,286,705 B2
(45) Date of Patent: Apr. 29, 2025

(54) COATING APPARATUS AND COATING METHOD HAVING DIVIDED PULSES

(71) Applicant: CemeCon AG, Würselen (DE)

(72) Inventors: Walter May, Aachen (DE); Werner Kölker, Herzogenrath (DE); Stephan Bolz, Aachen (DE)

(73) Assignee: CemeCon AG, Würselen (DE)

( * ) Notice: Subject to any disclaimer, the term of this patent is extended or adjusted under 35 U.S.C. 154(b) by 0 days.

(21) Appl. No.: 18/026,575

(22) PCT Filed: Sep. 6, 2021

(86) PCT No.: PCT/EP2021/074470
§ 371 (c)(1),
(2) Date: Mar. 15, 2023

(87) PCT Pub. No.: WO2022/058193
PCT Pub. Date: Mar. 24, 2022

(65) Prior Publication Data
US 2023/0340658 A1      Oct. 26, 2023

(30) Foreign Application Priority Data
Sep. 15, 2020   (DE) .............. 10 2020 124 032.5

(51) Int. Cl.
C23C 14/35   (2006.01)
C23C 14/34   (2006.01)
(Continued)

(52) U.S. Cl.
CPC .......... *C23C 14/35* (2013.01); *C23C 14/3485* (2013.01); *C23C 14/54* (2013.01); *H01J 37/3467* (2013.01)

(58) Field of Classification Search
CPC ..... C23C 14/35; C23C 14/3485; C23C 14/54; C23C 14/345; C23C 14/352; H01J 37/32706; H01J 37/3467
(Continued)

(56) References Cited

U.S. PATENT DOCUMENTS 7,531,070 B2 *   5/2009   Kuriyama ........... H02M 3/1582
                                                 204/298.08
9,771,648 B2 *   9/2017   Chistyakov ......... H01J 37/3423
(Continued)

FOREIGN PATENT DOCUMENTS

EP    2 784 799 A1    10/2014
EP    2 587 518 B1    12/2018
(Continued)

OTHER PUBLICATIONS

International Preliminary Report on Patentability issued Mar. 21, 2023, in corresponding International Application No. PCT/EP2021/074470, filed Sep. 6, 2021, 7 pages.
(Continued)

*Primary Examiner* — Rodney G McDonald
(74) *Attorney, Agent, or Firm* — CHRISTENSEN O'CONNOR JOHNSON KINDNESS PLLC

(57) ABSTRACT

The invention relates to a coating method and to a coating device for coating a body. A magnetron cathode having a target is arranged in the vacuum chamber. Electrical power is supplied to the magnetron cathode such that a plasma is generated and the target is sputtered in order to deposit a coating on the body. The electrical power is periodically supplied within a period duration T according to the HIPIMS method as cathode pulses, wherein each cathode pulse comprises at least two cathode sub-pulses and an intervening cathode sub-pulse break. In order to be able to deposit coatings having favorable properties in a particularly favor-
(Continued)

able manner by using the chopped HIPIMS method, a bias voltage is applied to the substrate to be coated with bias voltage pulses, wherein each bias voltage pulse comprises at least two bias sub-pulses and an intervening bias sub-pulse break.

30 Claims, 11 Drawing Sheets

(51) Int. Cl.
  *C23C 14/54* (2006.01)
  *H01J 37/34* (2006.01)
(58) Field of Classification Search
  USPC .......................... 204/298.06, 192.12, 298.08
  See application file for complete search history.

(56) References Cited

U.S. PATENT DOCUMENTS

| | | | |
|---|---|---|---|
| 2008/0135400 | A1 | 6/2008 | Kadlec et al. |
| 2019/0088457 | A1* | 3/2019 | Babayan ............... C23C 14/345 |

FOREIGN PATENT DOCUMENTS

| | | |
|---|---|---|
| EP | 3 457 428 A1 | 3/2019 |
| WO | 2006/049566 A1 | 5/2006 |
| WO | 2008/071732 A2 | 6/2008 |
| WO | 2013/045454 A2 | 4/2013 |
| WO | 2014/207154 A1 | 12/2014 |
| WO | 2015/038489 A1 | 3/2015 |

OTHER PUBLICATIONS

International Search Report mailed Dec. 21, 2021, issued in corresponding International Application No. PCT/EP2021/074470, filed Sep. 6, 2021, 7 pages.

Written Opinion mailed Dec. 21, 2021, issued in corresponding International Application No. PCT/EP2021/074470, filed Sep. 6, 2021, 7 pages.

Barker, Paul Michael et al., "Modified high power impulse magentron sputtering process for increased deposition rate of titanium," Journal of Vacuum Science & Technology A, Aug. 29, 2013, 5 pages, vol. 31, No. 6, American Vacuum Society.

Greczynski, Grzegorz et al., "Metal versus rare-gas ion irradiation during $Ti_{1-x}Al_xN$ film growth by hybrid high power pulsed magnetron/dc magnetron co-sputtering using synchronized pulsed substrate bias," Journal of Vacuum Science & Technology A, Sep. 7, 2012, 8 pages, vol. 30, No. 6, American Vacuum Society.

Wikipedia, "Sputtern," The Free Encyclopedia, printed on Apr. 12, 2021, 8 pages, located at https://de.wikipedia.org/wiki/Sputtern.

* cited by examiner

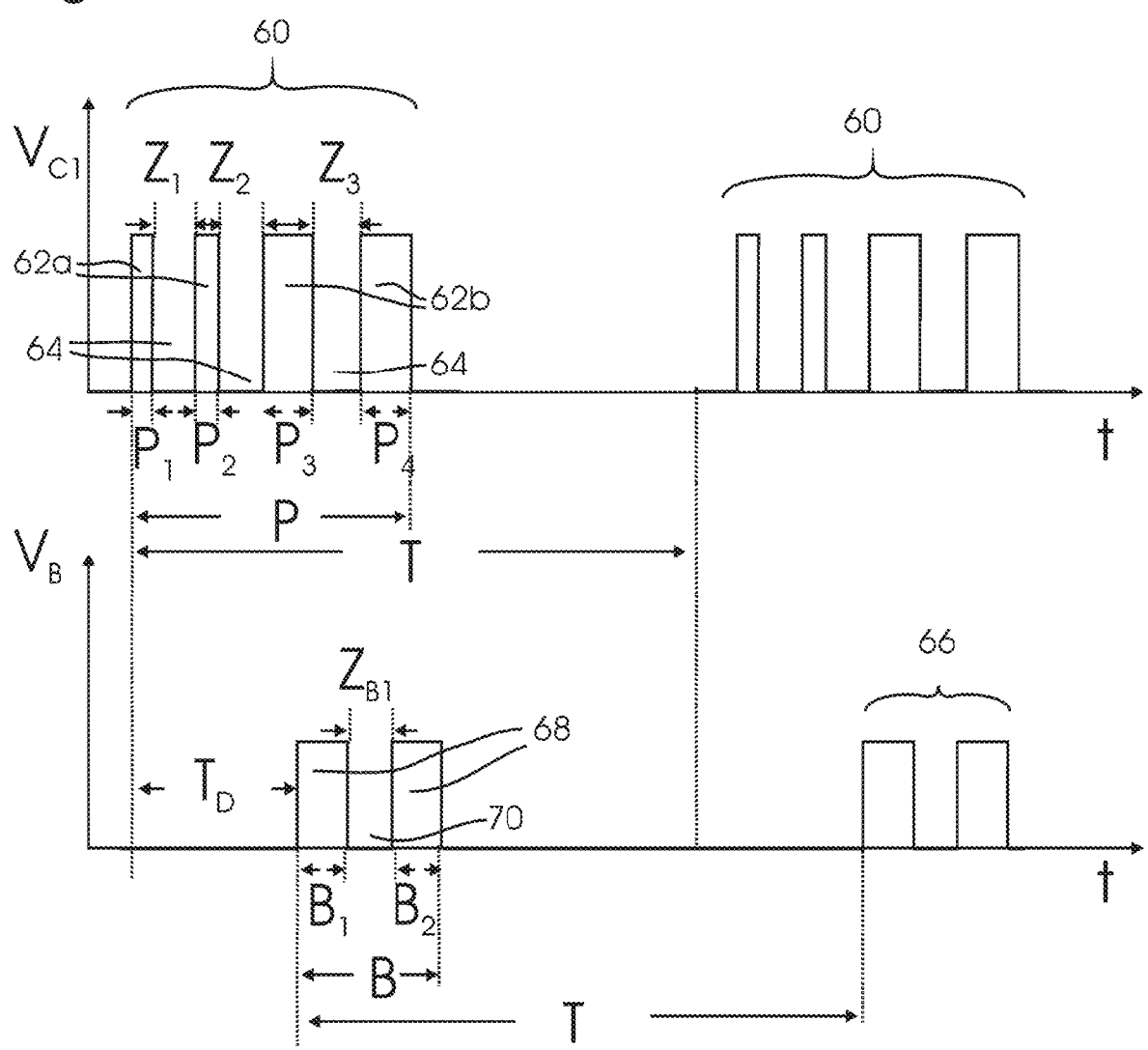

COATING APPARATUS AND COATING METHOD HAVING DIVIDED PULSES

FIELD OF THE INVENTION

The invention relates to coating methods and coating devices. In particular, the invention relates to methods and devices for coating a body by means of cathodic sputtering, wherein at least one cathode is supplied with electrical power according to the HIPIMS method.

BACKGROUND OF THE INVENTION

It is known to provide bodies or parts of bodies with a surface coating in order to improve the mechanical or chemical properties. In particular for tools and components which are subject to wear, it is known to provide functional faces with coatings.

In particular, hard material layers are known as coatings. To form thin coatings, in addition to CVD methods, particularly PVD coating methods are known, in particular the methods of cathode sputtering.

In the field of cathodic sputtering, the HIPIMS method (High Power Impulse Magnetron Sputtering) is relevant. In contrast to conventional cathodic sputtering, in which cathodes are operated at a constant electrical power, for example by means of a DC voltage, in HIPIMS short electrical pulses of a high voltage are applied to the cathode and very high peak powers are achieved. As a result, a significantly increased ionization of the plasma is achieved compared to conventional cathodic sputtering, resulting in advantageous properties of the coatings produced thereby.

In current further developments of the HIPIMS method, it has been proposed to subdivide the electrical pulses supplied to the cathodes, i.e. to apply a sequence of shorter pulses instead of a continuous cathode pulse, which pulses are referred to here as cathode sub-pulses and in their sequence form a subdivided cathode pulse. This method is referred to as "chopped HIPIMS" or DOMS (Deep Oscillation Magnetron Sputtering).

For example, Barker et al "Modified high power impulse magnetron sputtering process for increased deposition rate of titanium", Journal of Vacuum Science & Technology A: Vacuum, Surfaces and Films 31, 060604(2013), discloses the deposition of titanium layers by means of a modified HIPIMS method in which the HIPIMS pulses are divided into a sequence of pulses. Pulse sequences of a duration of 100 μs are applied in a variety of sequences at a frequency of 200 Hz and an average power of 0.75 kW, with 4 or 2 micropulses of varying durations and varying switch-off periods. The divided HIPIMS pulses have been reported to have a substantial effect on the deposition rate, which is higher than that of the conventional HIPIMS method.

Barker et al, "An investigation of c-HiPIMPS discharges during titanium deposition", Surface & Coatings Technology 258 (2014) 631-638, report of titanium layers deposited by means of chopped HIPIMS using pulse sequences having 4 or 8 micropulses. In the event of a longer delay between micropulses, a significantly increased deposition rate is reported, which can be explained by the ionization of the plasma.

EP 2587518 A1 discloses a device for producing ta-C layers that are at least substantially free from hydrogen on substrates (workpieces) consisting of metal or ceramic materials. A vacuum chamber is connected to a vacuum pump and to a source for inert gas. A support device is provided for the substrates (workpieces). At least one graphite cathode having an associated magnet arrangement forming the magnetron serves as the source for carbon material. A bias power supply is used to apply a negative bias voltage to the substrate. A cathode power supply is connected to the graphite cathode and to an associated anode and is designed to transmit high-power pulse sequences in (preferably programmable) time intervals. Each high-power pulse sequence comprises a series of high-frequency direct current pulses, which are adjusted to be supplied to the at least one graphite cathode, if applicable after a build-up phase.

EP 3 457 428 A1 discloses a method and a device for processing a substrate in a semiconductor processing system. The method begins with starting up a pulse synchronization controller that is coupled between a pulse RF bias voltage generator and a HIPIM generator. A first time signal is sent from the pulse synchronization controller to the pulse HF bias voltage generator and to the HIPIM generator. A sputter target and a HF electrode, which are arranged in a substrate carrier, are energized based on the first time signal. The target and the electrode are de-energized based on an end of the time control signal. A second time signal is sent from the pulse synchronization controller to the pulse HF bias voltage generator and the electrode is energized and de-energized without energizing the target in response to the second time control signal.

US 2008/0135400 A1 discloses a device for sputtering a target in order to produce a coating on a substrate. The device comprises a magnetron having a cathode and an anode. A power supply is connected to the magnetron and at least one capacitor is connected to the power supply. The device also comprises an inductor that is operatively connected to the capacitor. A first switch operably connects the power supply to the magnetron in order charge the magnetron according to a first pulse. A second switch is connected in order to discharge the magnetron according to a second pulse.

SUMMARY OF THE INVENTION

The object can be considered that of proposing methods and devices by means of which coatings having advantageous properties can be deposited in a particularly favorable manner using the chopped HIPIMS method.

To solve the object, a coating method and a coating device are proposed, wherein a bias voltage having a special pulse shape is applied to the substrate to be coated.

Dependent claims in each case refer to advantageous embodiments of the invention.

According to the invention, a coating method or, as the case may be, a coating device is proposed for coating a body, also referred to as a substrate. The substrate may, in particular, be a tool. Typically, a large number of individual bodies are coated at the same time.

According to the invention, a vacuum chamber having at least one magnetron cathode having a target is provided, in which vacuum chamber the body (substrate) is arranged. By supplying electrical power to the magnetron cathode, a plasma is generated, the target is sputtered, and a coating is deposited on the body, in that components of the plasma are deposited on the substrate surface. In the process, the electrical power is supplied in a pulsed manner according to the HIPIMS method in the form of cathode pulses, periodically with a period duration T. According to the chopped HIPIMS variant of the method, each cathode pulse is divided into at least two cathode sub-pulses between which there is a cathode sub-pulse break or sub-pulse gap in which no electrical power or an electrical power that is significantly reduced with respect to the cathode sub-pulses is applied. The cathode pulses thus form sequences of temporally spaced cathode sub-pulses.

The coating device according to the invention comprises a vacuum chamber having a receiving means for the body and having at least one magnetron cathode having a target and comprises an electrical cathode power supply and a control device. The cathode power supply is designed to supply electrical power to the magnetron cathode according to the HIPIMS method, such that cathode pulses are supplied periodically within the period duration T in order to generate the plasma and sputter the target. The control device is designed to control the electrical cathode power supply such that individual, some, or all parameters of the electrical power supplied to the magnetron cathode can be controlled, in particular the power, frequency, pulse shape and/or sequence, etc. The control device is designed to control the electrical cathode power supply according to such a sequence that each cathode pulse supplied to the cathode comprises two cathode sub-pulses and an intervening cathode sub-pulse break (or gap). The control device can, in particular, be a programmable control unit with which, preferably in addition to the cathode power supply, other functions of the coating device can also be controlled according to a coating program in a time-dependent manner, in particular a bias power supply and/or the supply of process and/or reactive gases.

The sequences of cathode sub-pulses provided according to the chopped HIPIMS method have the advantage that the danger of the formation of electrical arc discharges is reduced or, alternatively, forming arc discharges are terminated by means of a subsequent sub-pulse break. In addition, even higher ionization of the plasma than in the case of continuous HIPIMS cathode pulses can be achieved by means of the sequences of cathode sub-pulses.

The cathode pulses are applied as voltage pulses, and therefore subsequent descriptions and information relating to the duration, pulse shape, sequence, etc., always refer to the voltage considered at the magnetron cathode. The resulting current and thus the electrical power depend on the conditions in the plasma, in particular the ionization.

The cathode pulses may comprise various sequences of cathode sub-pulses. Preferably, these are voltage pulses. Sequences of, for example, 2-10 cathode sub-pulses per cathode pulse, preferably 3-8 cathode sub-pulses, more preferably 4-6 cathode sub-pulses, have proven advantageous. The duration of the cathode sub-pulses may generally be, for example, 4-80 µs, preferably 5-50 µs or 6-35 µs, particularly preferably 8-25 µs. As explained below, the cathode sub-pulses may always have the same duration, although sequences within which cathode sub-pulses have different durations are preferred.

Within the respective sequences of cathode sub-pulses, there are cathode sub-pulse breaks (or gaps) between the cathode sub-pulses. The duration of the cathode sub-pulse break(s) is preferably on average shorter than the duration of the cathode sub-pulses. For example, the duration of the cathode sub-pulse break(s) may generally be 2-30 µs, preferably 5-25 µs, particularly preferably 8-20 µs. The duration of the cathode sub-pulses within the sequence may be the same or different.

According to the invention, a bias voltage in the form of bias voltage pulses that are periodic within the period duration is applied to the body. Each bias voltage pulse is divided, i.e. comprises at least two bias sub-pulses and an intervening bias sub-pulse break (or gap).

The bias voltage applied to the substrate is negative, and therefore positive ions of the plasma are accelerated towards the substrate surface. In contrast to the known use of a DC voltage, the bias voltage according to the invention is applied in a pulsed manner, and likewise with sequences of individual bias sub-pulses each with bias sub-pulse break(s) in between. The frequency or rather period duration of the pulse sequence of the bias voltage is the same as that of the electrical power or voltage at the cathode.

Such a specification for a temporal progression of the bias voltage that is synchronized with the temporal progression of the voltage at the cathode results in particular control possibilities with regard to a selection of the components of the plasma that form the coating. As has been shown, the composition of the ions of the plasma during operation of the cathode in the chopped HIPIMS method, i.e. with temporally spaced cathode sub-pulses, is time-dependent, i.e. different ions predominate in the plasma at different times. By adjusting the temporal progression of the bias voltage hereto, it is possible to select, in a targeted manner, types of ions that are integrated in the layer.

This relates, in particular, to an influencing of the respective quantity of metal and gas ions in the structure of the coating, which is possible on account of suitable timing. It could be observed that the quantity of gas ions contained in the plasma, in particular ions of the process gas, for example argon, has a temporal progression that deviates from the quantity of metal ions from the start of the cathode sub-pulse. The respective quantity of gas and metal ions in the coating can therefore be adjusted in a targeted manner by suitably selecting the duration and start time of the bias sub-pulses relative to the cathode sub-pulses. Here, the quantity of the argon preferably used as the process gas has a decisive influence on the properties of the coating: Thus, it has been shown that, at comparably high proportions of argon, coatings can be achieved with very high hardness and high internal stress, i.e. hard and brittle layers, while layers without argon or with a lower proportion are rather ductile in comparison.

The use according to the invention of a "chopped bias", i.e. a divided bias voltage, also promotes an advantage of the chopped HIPIMS method, namely the suppression of arc discharges (arcs). By dividing the cathode pulses into at least two cathode sub-pulses with a cathode sub-pulse break in between, the formation of arc discharges is inhibited—due to the power being switched off during the cathode sub-pulse break, any electric arc cannot form fully and thus causes hardly any damage to the system (e.g. target) and, above all, to the coating of the body. It is assumed that this effect is additionally supported if the bias voltage pulses are divided and have at least one bias sub-pulse break per period. During the bias sub-pulse break, the electrical power is also reduced or entirely switched off at the body, and therefore, under certain circumstances, nascent electric arcs are inhibited in their formation and extinguished. This not only applies when the bias sub-pulses overlap with the cathode sub-pulse breaks or are completely congruent, but also in the case of a time delay.

Advantageous developments of the invention relate, in particular, to the timing of bias voltage pulses and cathode pulses or rather bias sub-pulses and cathode sub-pulses.

Preferably, at least one of the bias sub-pulses starts with a delay time after the start of one of the cathode sub-pulses, more preferably multiple or all bias sub-pulses can start with a delay time after the start of an associated cathode subpulse. For example, the delay times of multiple or all bias sub-pulses may be the same for each associated cathode sub-pulse.

The respective sequences of bias sub-pulses and cathode sub-pulses may be temporally adjusted to one another, but the sequences do not have to be congruent and may, for example, have a different number and duration of the respective sub-pulses. For example, the temporal spacing between two bias sub-pulses may correspond to the temporal spacing between two cathode sub-pulses, at least substantially (i.e. with deviations of preferably less than +/−10%). The temporal spacing is preferably to be measured between the respective start of bias sub-pulses and cathode sub-pulses. The bias sub-pulses and cathode sub-pulses considered in comparison may temporally follow directly one from another or additional bias sub-pulses and cathode sub-pulses may be provided in between. Preferably, one, more, or all bias sub-pulse breaks may have substantially the same duration as respectively associated cathode sub-pulse breaks.

The number of bias sub-pulses may be the same as or deviate from the number of cathode sub-pulses. In some preferred embodiments, the number of bias sub-pulses may be less than the number of cathode sub-pulses, i.e. there is not an associated bias sub-pulse for each of the cathode sub-pulses. For example, bias sub-pulses may be provided in a targeted manner so as to be associated only to cathode sub-pulses of a higher power, while no associated bias sub-pulse is provided for one or more cathode sub-pulses of a lower power.

The duration of the bias sub-pulses and/or of the bias sub-pulse breaks may preferably be within the same interval as the duration of the cathode sub-pulses and/or cathode sub-pulse breaks. The delay time between the start of a cathode sub-pulse and the start of an associated bias sub-pulse may, for example, be 5-200 µs, preferably 10-150 µs, particularly preferably 10-60 µs.

It is possible for the bias voltage pulses to at least partially overlap with the cathode pulses, i.e. at least part of every bias voltage pulse may be applied at the same time as at least part of one of the cathode pulses. However, this is not necessary in all cases. In some applications, it has also proven advantageous to delay the bias voltage pulses with respect to the cathode pulses to such an extent that there is in fact no more temporal overlap.

The sequences of cathode sub-pulses and bias sub-pulses may be adjusted to one another, in particular each cathode sub-pulse may be associated to a bias sub-pulse that preferably starts with a time delay and, for example, has at least substantially the same duration. Therefore, the number of bias sub-pulses may the same as the number of cathode sub-pulses. However, it may also be preferable if the number of bias sub-pulses is less than the number of cathode sub-pulses, such that, for example, not every cathode sub-pulse, but rather only some of the cathode sub-pulses can have an associated bias sub-pulse of, for example, at least substantially the same duration, for example in each case with a time delay. This may be preferable, in particular, in the case of cathode sub-pulses of different durations: If, for example, a somewhat low peak power is achieved in short cathode sub-pulses, it may be advantageous not to provide an associated bias sub-pulse for same and thus to dispense with accelerating the ions produced at the lower peak power toward the body to be coated.

According to a preferred embodiment, the temporal evolution of the plasma and the formation and progression of various types of ions can be taken into account for the relevant sequence of cathode sub-pulses in order to define an optimized sequence of bias sub-pulses. Thus, for example, gas and metal ions can be considered separately and a sequence of bias sub-pulses may be selected such that desired types of ions are preferably used to form the coating. Metal ions are particularly preferable. For example, it can be observed that a time-dependent progression of the occurrence of various types of ions, specifically gas and metal ions, results during and after the cathode pulses. Taking into account one type of metal ions (whereby different types of metal ions differ from one another on account of the relevant metal and it additionally being possible to distinguish between different types based on the degree of ionization), it is possible in many cases to determine a temporal progression for same with one maximum or multiple maxima. In this case, it is preferred to select the sequence of bias sub-pulses such that at least one of the bias sub-pulses is applied during at least one maximum. If the temporal progression comprises multiple maxima, two or more bias sub-pulses are preferably applied such that they are applied during at least one of the maxima in each case. Further preferably, a sub-pulse break may be provided for at least one type of metal ions during a minimum of the temporal progression between two maxima. It is thus possible to select suitable sequences of bias sub-pulses such that desired types of ions are selected in accordance with the time sequence of the occurrence of metal ions and are used to buildup the coating in preference to other ions, in particular gas ions.

The invention can be supplemented and further developed in a variety of aspects, for example by an aspect relating to advantageous sequences of cathode sub-pulses of different durations, an aspect relating to chopped HIPIMS methods having a short period duration or rather high frequency, and an aspect relating to advantageous system technology having a capacitor and a charging device. While each of these aspects offers individual advantages, especially the combination of two or more of the above-mentioned aspects has proven advantageous.

According to one aspect as a development of the invention, at least two of the cathode sub-pulses differ in their duration. The cathode pulses comprise at least one first and one second cathode sub-pulse, which each last for at least 8 µs. The first and the second cathode sub-pulse differ in their duration.

The designations "first" and "second" cathode sub-pulse should primarily be understood in general to mean that the second cathode sub-pulse occurs at a later time than the first cathode sub-pulse within the sequence of cathode sub-pulses, without the first and second cathode sub-pulse necessarily having to follow on one immediately after another and regardless of whether the first cathode sub-pulse is the first cathode sub-pulse in terms of time within the sequence of cathode sub-pulses. Preferably, however, the above-mentioned first cathode sub-pulse may also be the first, i.e. earliest, cathode sub-pulse within the sequence and the above-mentioned second cathode sub-pulse may be the cathode sub-pulse that follows on immediately after the subsequent cathode sub-pulse break within the sequence.

By varying the duration of the cathode sub-pulses in this manner, the plasma can be influenced in a targeted manner. This is because, although the applied voltage in the cathode sub-pulse break separating the cathode sub-pulses is zero or close to zero, it has surprisingly been shown that the plasma behaves differently in successive cathode sub-pulses, for example due to residual ionization persisting over the cathode sub-pulse break. The proposed variation of the duration of the cathode sub-pulses makes it possible to utilize such effects in the plasma and, in particular, to define optimized sequences of cathode sub-pulses.

It is thus possible, for example, to achieve pre-ionization by means of one or more shorter cathode sub-pulses and the pre-ionization can be used to achieve a particularly high peak power in one or more subsequent longer cathode sub-pulses that follow either immediately or with a time gap.

According to a preferred embodiment, the above-mentioned first cathode sub-pulse is the first cathode sub-pulse of the cathode pulse in terms of time, i.e. of the sequence of cathode sub-pulses. The above-mentioned second cathode sub-pulse follows on at a later time within the sequence, wherein it may follow immediately on from the first cathode sub-pulse or additional cathode sub-pulses may be provided temporally between the first and second cathode sub-pulse. The first cathode sub-pulse is preferably shorter than the second cathode sub-pulse. For example, the duration of the second cathode sub-pulse may be 110% to 600% of the duration of the first cathode sub-pulse, preferably 150% to 400%, particularly preferably 200% to 300%. With a sequence of such cathode sub-pulses, a particularly high peak power can be achieved during the second cathode sub-pulse.

In preferred embodiments, the second cathode sub-pulse may, for example, last for at least 15 µs, preferably at least 20 µs, particularly preferably at least 25 µs. The first cathode sub-pulse may, for example, last for at most 25 µs, preferably at most 20 µs, particularly preferably at most 15 µs.

In sequences having more than two cathode sub-pulses, it is preferred for the pulse durations of temporally successive cathode sub-pulses to increase monotonically, i.e. always last for the same amount of time or for longer from one to the next cathode sub-pulse in the temporal sequence. According to a preferred embodiment, the cathode pulse may, for example, comprise a third cathode sub-pulse that temporally follows the first and the second cathode sub-pulse and lasts at least as long as the first and at least as long as the second cathode sub-pulse.

According to one aspect as a development of the invention, the chopped HIPIMS method is carried out at an unusually short period duration of at most 1.5 ms, i.e. an unusually high frequency of the pulses at the magnetron cathode of at least 667 Hz. Usual implementations of the HIPIMS method proceed from a much lower frequency or rather higher period duration. The inventors have recognized that the short period durations are surprisingly also possible and advantageous using the chopped HIPIMS method with significantly increased peak powers. Even shorter period durations of, preferably, 1.25 ms or less (corresponding to a frequency of at least 800 Hz) or 1 ms or less (corresponding to a frequency of at least 1 kHz) are even possible. In some embodiments, even shorter period durations of 0.2-0.6 ms (1.7-5 kHz) can be used.

At the thus unusually high frequencies, the power is delivered within very short periods of time, but with exceptionally high peak electrical power, resulting in high ionization. A high deposition rate has proven to be the main advantage of the high frequency, i.e. a faster build-up of layers with respect to lower frequencies. This has a decisive influence on the economic viability of the method and device during industrial use.

The cathode pulse itself, i.e. the total duration of the sequence of cathode sub-pulses and thus the time within which electrical power is applied in the form of cathode sub-pulses, preferably only takes up part of the period duration, for example less than half of the period duration and, particularly preferably, at most one third of the period duration. This is particularly advantageous if the cathode pulses are fed from a charged capacitor. The capacitor is thus discharged during the individual cathode sub-pulses throughout the entire duration of the cathode pulses and is recharged throughout the remaining period duration. A sufficient time for charging the capacitors can be provided by restricting the duration of the cathode pulses. The duration of the cathode pulse is preferably in the range of from 30 µs-400 µs, particularly preferably 80 µs-300 µs.

According to one aspect as a development of the invention, the electrical power, which is supplied to the cathode in the form of cathode sub-pulses, is provided from at least one charged capacitor of a cathode power supply. The cathode power supply comprises a capacitor, preferably provided in the form of multiple individual capacitors connected in parallel (capacitor bank), as well as a charging device for same.

A setup of this kind has proven particularly suitable for providing electrical power according to the chopped HIPIMS method. In this case, preferably the entire electrical power of all cathode sub-pulses is delivered from the same capacitor, wherein the electrical connection to the cathode is closed by means of a switch for the duration of the cathode sub-pulses and is disconnected during the cathode sub-pulse break(s) and for the remaining period duration. The switch can preferably be controlled by means of the control device, for example it may be an IGBT. The charging device may deliver electrical power to the capacitor at least during the period duration outside of the cathode pulses in order to charge said capacitor, preferably also during the cathode sub-pulse break(s). Particularly preferably, the charging device may remain constantly connected to the capacitor, such that it is connected, for example, in parallel during the cathode sub-pulses.

According to a preferred embodiment, the charging device may be controlled in a power-constant manner, i.e. designed such that the power supplied to the capacitor (or, if applicable, to a parallel circuit consisting of capacitor and chamber during the pulse) and averaged over time is set to a fixed value. This has proven particularly stable in contrast with alternative possible concepts such as that of setting a fixed voltage to which the capacitor is charged.

The various aspects and developments of the invention are in each case advantageous individually, but particularly so in combination. In the following, some preferred embodiments will be specified which can be used with each individual aspect, but also with combinations of any two, three, or all four aspects.

According to one development, the cathode pulse is a voltage pulse with a peak value of 600-1200V. While the values may vary individually depending on the embodiment, this range for the voltage value has proven preferable.

The cathode sub-pulses may have various progressions and pulse shapes, for example as triangular pulses. Preferably, the cathode pulses are at least substantially rectangular pulses or trapezoidal pulses, i.e. they have a temporal progression with a steep rising and falling edge and an approximately linear progression therebetween. In particular in the preferred case of feeding the cathode pulses from a charged capacitor, the progression corresponds to a discharge curve upon closer inspection, however, preferably, such a short section of the discharge curve is selected that the progression preferably does not deviate at any point from a linear progression between a start voltage (after the steep rising edge) and an end voltage (before the steep falling edge) by more than 20%, particularly preferably by no more than 10%. It has proven advantageous for the progression between the start voltage and the end voltage to be at least substantially constant, which should in this case be understood to mean that the voltage value does not change by more than at most 25%, particularly preferably at most 20%. Pulses of this kind are in this case considered to be substantially rectangular pulses.

In preferred embodiments, the peak power of at least one of the cathode sub-pulses is at least 50 kW. Further preferably, significantly higher peak powers may be achieved, for example of more than 100 kW, of 200 kW or higher, particularly preferably of 300 kW or higher. It has been shown that the magnitude of the maximum peak power of cathode sub-pulses has a significant influence on the ionization of metals of the target material. For example, investigations show that, in the case of a titanium target material, the ratio of ionized to non-ionized particles (Ti+/Ti) at a maximum peak power of a cathode sub-pulse of almost 500 kW is almost twice as high as when the maximum peak power of the cathode sub-pulses is 150 kW.

Preferably, the peak power achieved during the cathode sub-pulses increases within the temporal sequence of the cathode pulse. According to a preferred embodiment, the cathode pulse may, for example, comprise at least a first cathode sub-pulse and a second, temporally subsequent cathode sub-pulse. The second cathode sub-pulse may follow immediately on from the first cathode sub-pulse (after an intervening cathode sub-pulse break) or additional cathode sub-pulses may be provided in between. It is preferable, in this case, that the peak power during the second cathode sub-pulse is at least 30% higher than during the first cathode sub-pulse. In this way, particularly high peak powers can be achieved overall.

The invention is applicable with a wide variety of target materials and material combinations. The target may comprise both metal and non-metal materials. Preferably, at least one of the components of the target is selected from the group comprising the materials from groups 4 to 6 of the periodic table as well as, additionally, boron, carbon, silicon, yttrium and aluminum. Preferably, all components of the target are selected from the above-mentioned group. By means of the method according to the invention and the device according to the invention, coatings can be produced of different material systems, which are formed by the target components as well as, if applicable, by components supplied in gaseous form. Therefore, in addition to a process gas, a reactive gas, for example nitrogen, a carbon-containing gas, or oxygen can in particular also be used.

The bias voltage applied to the body to be coated is preferably pulsed with bias voltage pulses that are synchronous with the cathode pulses, i.e. are applied with the same frequency and fixed phase relationship. It is preferable for the position and duration of the pulses to be selected such that types of ions are selected in a targeted manner. The position and/or duration can be selected depending on a progression of the occurrence of at least one type of metal ions during and after the cathode pulses that has at least one maximum. In this case, it is preferable for the bias pulse to be applied during said maximum.

BRIEF DESCRIPTION OF THE DRAWINGS

Embodiments of the invention are described in greater detail below with reference to drawings, in which:

FIG. 5a, 5b show schematically represented temporal progressions of a cathode voltage and of a bias voltage over time;

DETAILED DESCRIPTION OF EMBODIMENTS

Figure 1:
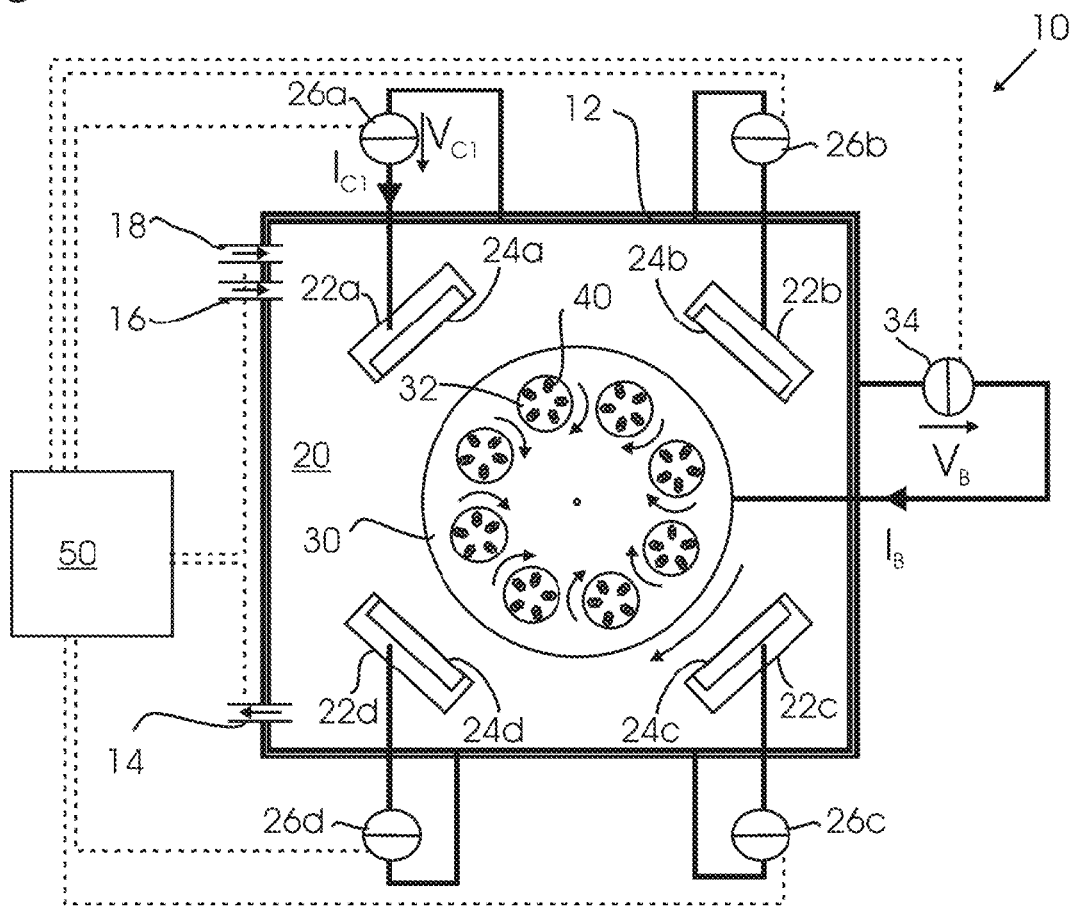
FIG. 1 is a schematic representation in plan view of a coating system as an embodiment of the invention.

FIG. 1 schematically shows components of an embodiment of a PVD coating system 10. An interior 20 of a vacuum chamber 12 can be evacuated by means of a vent 14 in order to produce a vacuum. A process gas, preferably a noble gas or mixture of various noble gases, e.g. argon and/or krypton, can be fed in via an inlet 16. A reactive gas such as nitrogen can be fed in via an inlet 18. In alternative embodiments, the inlets 16, 18 may be replaced with a common inlet for a process gas and a reactive gas.

In an exemplary assembly, four magnetron cathodes 22a, 22b, 22c, 22d, each having planar sputter targets 24a, 24b, 24c, 24d, are arranged in the interior 20 of the vacuum chamber 12. The magnetron cathodes 22a, 22b, 22c, 22d are connected to a respective controllable electrical HIPIMS power supply 26a, 26b, 26c, 26d, by means of which an electrical voltage can be applied relative to the electrically conductive wall of the vacuum chamber 12, as described in detail below.

The arrangement and circuitry of four magnetron cathodes 22a, 22b, 22c, 22d shown in FIG. 1 are to be understood as examples. In alternative embodiments, other electrode configurations may be provided, for example only one magnetron cathode 22, two, three, or more than four. In addition or as an alternative to the magnetron cathodes 22a, 22b, 22c, 22d shown, which are each connected to HIPIMS power supplies 26a, 26b, 26c, 26d, cathodes of another type may also be provided, for example DC magnetron cathodes that are connected to DC voltage power supplies. The magnetron cathodes may alternatively be electrically connected otherwise, opposed to a separate anode (not shown) rather than to the wall of the vacuum chamber 12 as shown by way of example.

Figure 4:
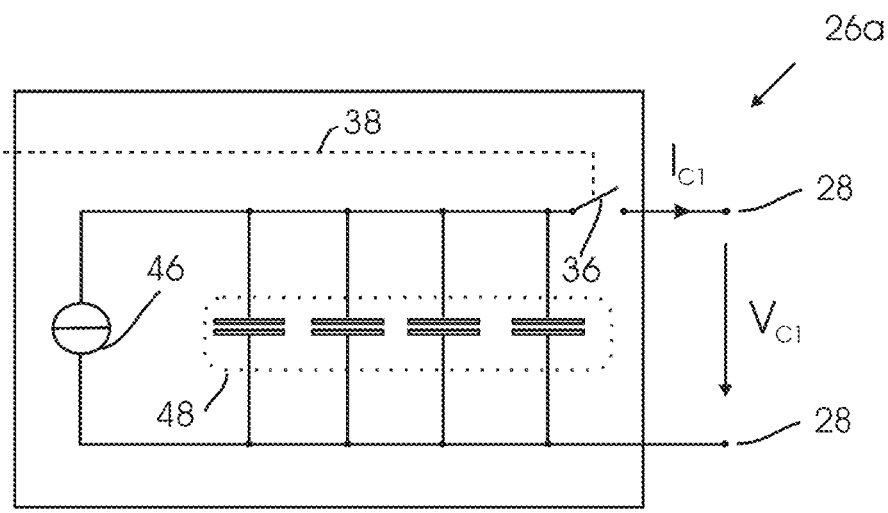
FIG. 4 is a circuit diagram of an embodiment of a HIPIMS power supply.

The power supplies 26a, 26b, 26c, 26d are shown in a merely schematic manner in each case in FIG. 1. FIG. 4 shows a simplified circuit diagram of a HIPIMS power supply 26a. As the capacitor 48, said power supply comprises a capacitor bank consisting of a number of capacitors connected in parallel, a charging device 46 for the capacitor 48 and a controllable switch 36, which is preferably designed as an IGBT.

In the embodiment shown, the charging device 46 is a power-controlled voltage source, which is connected in parallel with the capacitor 48. The capacitor 48 is connected to output terminals 28 of the HIPIMS power supply 26a via the switch 36. When the switch 36 is open, the charging device 46 charges the capacitor 48. When the switch is closed, the charge stored in the capacitor 48 is provided to the output terminals 28, i.e. supplied to the magnetron cathode 22a (FIG. 1), wherein power is also provided by the charging device 46 connected in parallel. The switch 36 is controlled by means of a controller 38 of a control unit 50 of the system 10.

Figure 2:
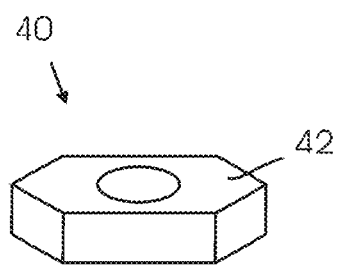
FIG. 2 shows an indexable insert as the body to be coated.

The magnetron cathodes 22a, 22b, 22c, 22d are oriented with their sputtering targets 24a, 24b, 24c, 24d are oriented toward the center of the vacuum chamber 12. In said vacuum chamber, there is a rotatable substrate table 30, on which a number of rotatable substrate carriers 32 are arranged for carrying substrates 40, i.e. bodies to be coated. In the example shown, indexable inserts 40 are loaded as substrates, as shown in FIG. 2. The substrates 40 consist of a substrate material 42, for example WC/Co sintered material in the case of the indexable inserts 40. However, this is only an example of a substrate 40 to be coated; alternatively, components or tools of different shapes and different materials may be coated.

The substrates 40 are electrically connected to the substrate table 30 via the substrate carriers 32. A controllable bias power supply 34 by means of which an electrical bias-voltage $V_B$ relative to the wall of the vacuum chamber 12 can be applied to the substrate table 30 and thus the substrates 40 is connected to the substrate table 30. This produces anion flow in the plasma that can be measured as a bias current $I_B$ at the connection of the substrate table. The connection of the bias power supply to the wall of the vacuum chamber should be understood as an example and, alternatively, the bias power supply may be connected to a separate anode.

The HIPIMS power supplies 26a, 26b, 26c, 26d, bias power supply 34, and pumps (not shown) at the inlets and outlets 14, 16, 18 are each connected to a central control unit 50 of the system 10. The central control unit 50 can be programmed such that all parameters of the pretreatment and coating methods taking place in the interior 20 of the vacuum chamber 12 are controlled by means of the control unit 50 according to a predetermined and stored time-dependent control program. The control program may be changed and the control unit 50 may store multiple different control programs that can be retrieved in a selective manner. When reference is made in the following to processes and settings during operation of the system 10, these are predefined in a control program which is executed by means of the control unit 50.

During operation of the system 10, as specified by the respective control program running in the control unit 50, a vacuum is initially generated in the interior 20 of the vacuum chamber 12 and, subsequently, a process gas, preferably argon, is admitted. Then, the substrates 40 are pretreated by means of ion etching. During etching, the bias power supply 34 is controlled such that it delivers a high (negative) bias voltage $V_B$, by means of which the (positive) ions are accelerated onto the substrate. Gas and/or metal ions can be used for the etching and various processes are possible.

In a preferred embodiment, gas ion etching initially takes place without the magnetron cathodes 20 being operated in the HIPIMS operating mode. The gas ion etching may be implemented as DC etching by applying a bias voltage $I_B$ as a DC voltage, for example in the range of −100 V to −400 V, or alternatively as MF etching (bias voltage $I_B$−100 V to −700 V). During DC etching, the electrons are generated by means of a hollow cathode (not shown) and discharged at an anode (not shown). The substrate table 30 is located between the anode and the hollow cathode. During MF etching, an MF power supply (not shown) is responsible for generating the electrons, which in turn ionize the gas. Said electrons are discharged at the wall of the vacuum chamber 12 (operating ground).

After the gas ion etching, metal ion etching may be used to further improve the adhesion. For example, one or two of the magnetron cathodes 22a-d (equipped, for example, with targets made of Cr, Ti, V), are operated in the HiPIMS operating mode at such a high peak power that the donor material is ionized. In addition, a bias voltage $V_B$ is applied either as a DC voltage (DC) or in a pulsed manner, wherein pulses of the bias voltage $V_B$ can be synchronized with the cathode pulses. The bias voltage $V_B$ is preferably between −300 and −1200 V.

Figure 3:
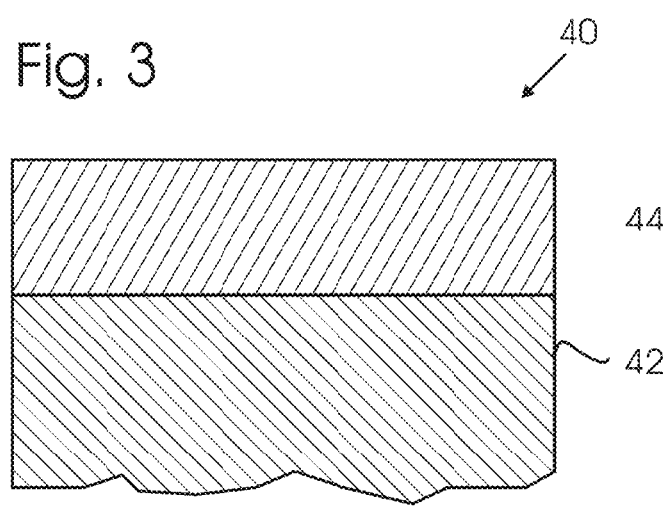
FIG. 3 is a schematic sectional view of a coating on a substrate material.

Subsequently, a coating 44 (FIG. 3) is deposited on the thus pretreated substrate surface. For this purpose, the HIPIMS power supplies 26a, 26b, 26c, 26d and the bias power supply 34 are controlled so as to deliver a suitable bias voltage $V_B$ and suitable cathode voltages $V_C$; examples of this are explained below. The inlets 16, 18 are controlled so as to supply process gas (argon) and, if applicable, reactive gas (e.g. nitrogen). A plasma is thus generated in the interior 20 of the vacuum chamber 12, under which plasma the targets 24a are sputtered. Positive ions of the plasma are accelerated by means of the negative bias voltage $V_B$ toward the surface of the substrate materials 42 of the substrates 40 and form a coating 44 there (FIG. 3).

In the process, the electrical power is supplied from the HIPIMS power supplies 26a, 26b, 26c, 26d to the magnetron cathodes 22a, 22b, 22c, 22d according to the HIPIMS method in periodic pulses. The electrical power is supplied according to the chopped HIPIMS method, as shown schematically, for example, in FIG. 5a, 5b for the progression of the voltage $V_{C1}$ at the first magnetron cathode 22a, in the form of cathode pulses 60 of a pulse duration P, which are in turn divided into—in the example shown in FIG. 5a three and in FIG. 5b four—cathode sub-pulses 62 having pulse durations $P_1$, $P_2$, $P_3$, $P_4$. Between the cathode sub-pulses 62, there are cathode sub-pulse breaks 64 having time durations $Z_1$, $Z_2$, $Z_3$, in which no voltage is applied. The cathode pulses 60 are periodic with a frequency f or rather a period duration T. After the end of the cathode pulses 60, no voltage is applied for the remainder of the period duration T.

Figure 5A:
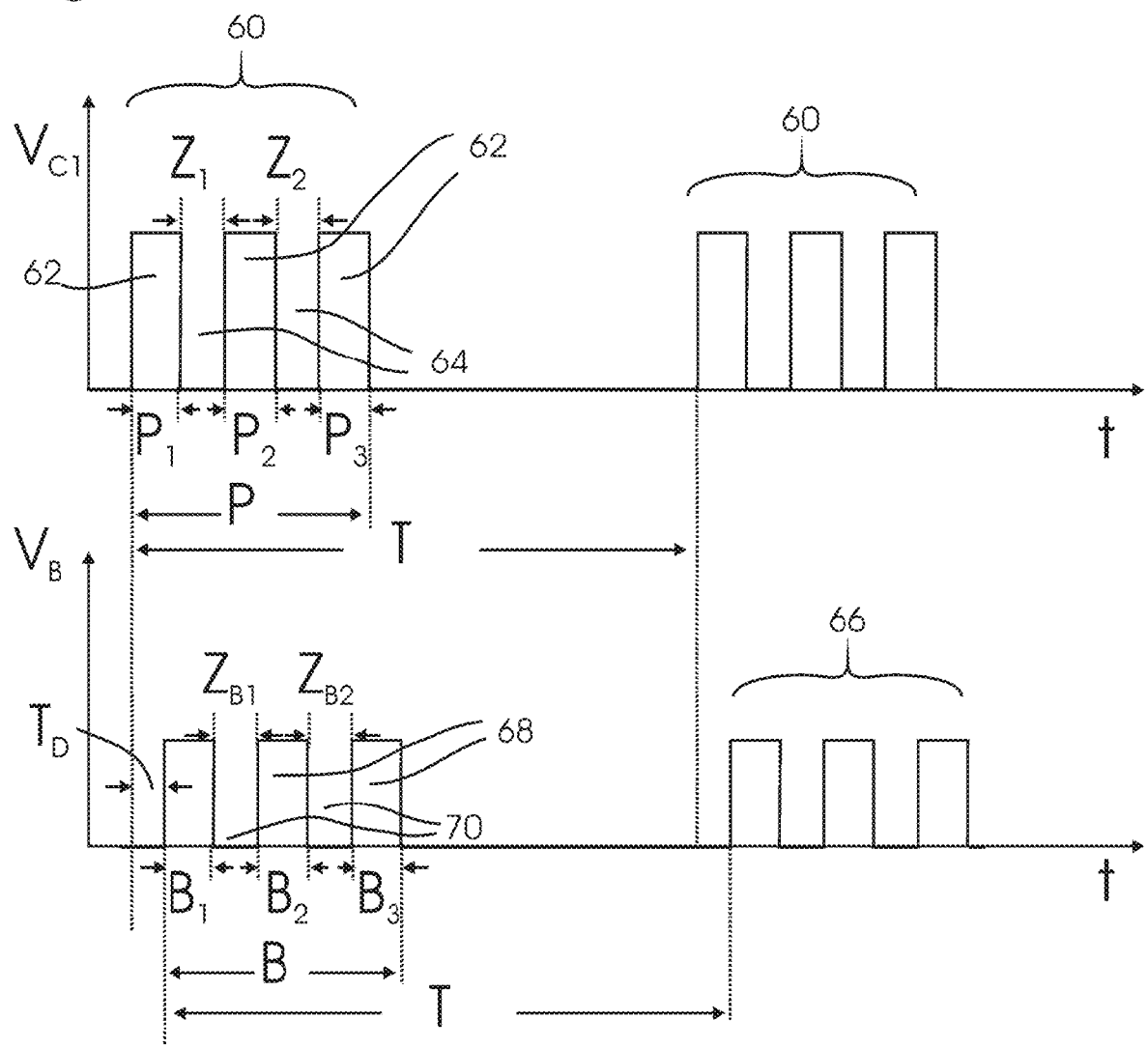

In the example of FIG. 5a, the sequence of the cathode pulses 60 comprises three cathode sub-pulses 62 each of the same duration $P_1$, $P_2$, $P_3$. In the example of FIG. 5b, another sequence of cathode sub-pulses 62a, 62b is shown with initially two shorter cathode sub-pulses 62a and then two longer cathode sub-pulses 62b.

The pulse sequences of the voltage $V_{C1}$ at the magnetron cathode shown in FIG. 5a, 5b are predefined by means of the controlling of the HIPIMS power supplies 26a-d by the control unit 50, specifically by means of suitable controlling of the switches 36 in the HIPIMS power supplies 26a-d. It should be noted here that the representation in FIG. 5a, 5b is an idealized rectangular pulse shape by way of simplification, whereas actual voltage curves deviate herefrom, as discussed below and shown separately. In particular, the real pulse shapes exhibit some degree of drop in the form of a discharge curve of the capacitor 48 over the duration of the cathode sub-pulses, but with some degree of recharging by the charging device 46 during the cathode sub-pulse breaks 64.

The bias voltage $V_B$ may have various temporal progressions throughout the duration of coating, depending on the embodiment. In particular, the bias voltage $V_B$ may be applied as a DC voltage or in a pulsed manner. Examples of preferred embodiments are shown schematically in FIG. 5a, 5b.

In the example of FIG. 5a, the bias voltage $V_B$ is applied in the form of three bias pulses 66 of a total duration B, wherein the bias pulses 66 with the same frequency or rather period duration T are periodic as the cathode pulses 60. Like the cathode pulses 60, the bias pulses 66 are also divided, namely into bias sub-pulses 68 of the respective duration $B_1$, $B_2$, $B_3$ with intervening bias sub-pulse breaks 70 of the respective duration $Z_{B1}$, $Z_{B2}$. The sequence of the bias sub-pulses 68 within each bias pulse 66 corresponds to the sequence of the cathode sub-pulses 64 within each cathode subpulse 60, i.e. each cathode sub-pulse 64 is associated a bias sub-pulse 68 of the same duration, but with a time offset, namely in each case with a delay by a delay time $T_D$.

In the example of FIG. 5b, the bias voltage $V_B$ is applied in the form of only two bias sub-pulses 66 within each period duration T. In this case, the sequence of the bias sub-pulses 66 only corresponds partially to the sequence of the cathode sub-pulses 64a, 64b, since a bias sub-pulse 68 is not associated to each cathode sub-pulse 64: No bias sub-pulse is associated to the two first, shorter cathode sub-pulses 64a, while associated bias sub-pulses 68 of the same duration follow the longer third and fourth cathode sub-pulse, in each case with a delay by a delay time $T_D$.

The pulse sequences of the bias voltage $V_B$ shown in FIG. 5a, 5b are also shown in idealized form. As with the pulse sequences of the cathode voltage $V_{C1}$, they are predefined by the control unit 50 by means of suitable controlling of the bias power supply 34. Said bias power supply also comprises a controllable switch (not shown), by means of which, depending on the embodiment, either a capacitor bank is selectively connected to the output, as is preferred and as is the case with the HIPIMS power supply 26a, or alternatively a DC voltage source is directly connected to the output.

Figure 6A:
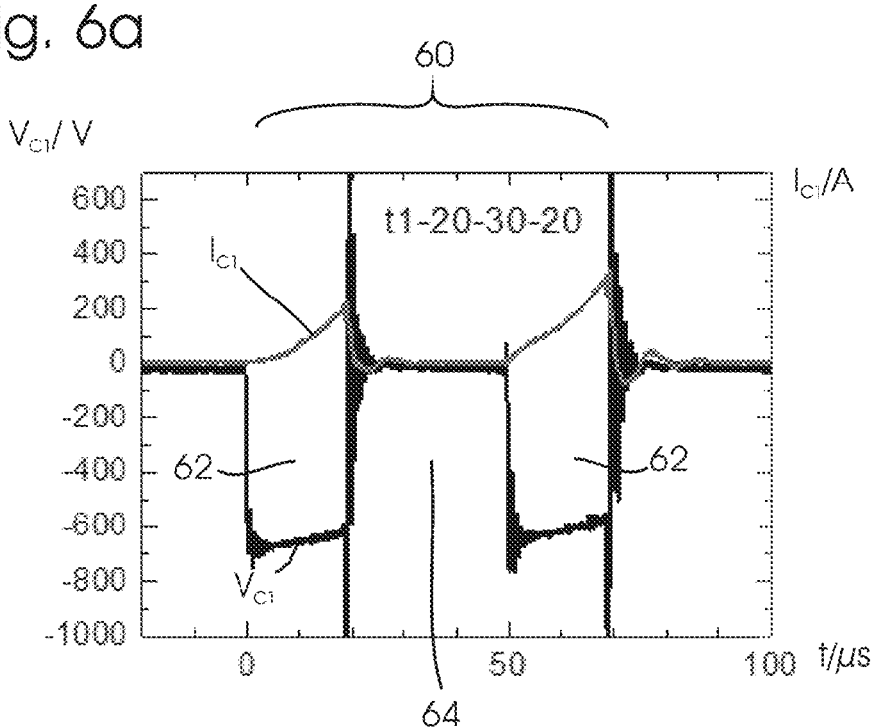
FIG. 6a, 6b show measured temporal progressions of the cathode voltage and cathode current as well as of the quantity and types of ions for a first exemplary embodiment.
Figure 6B:
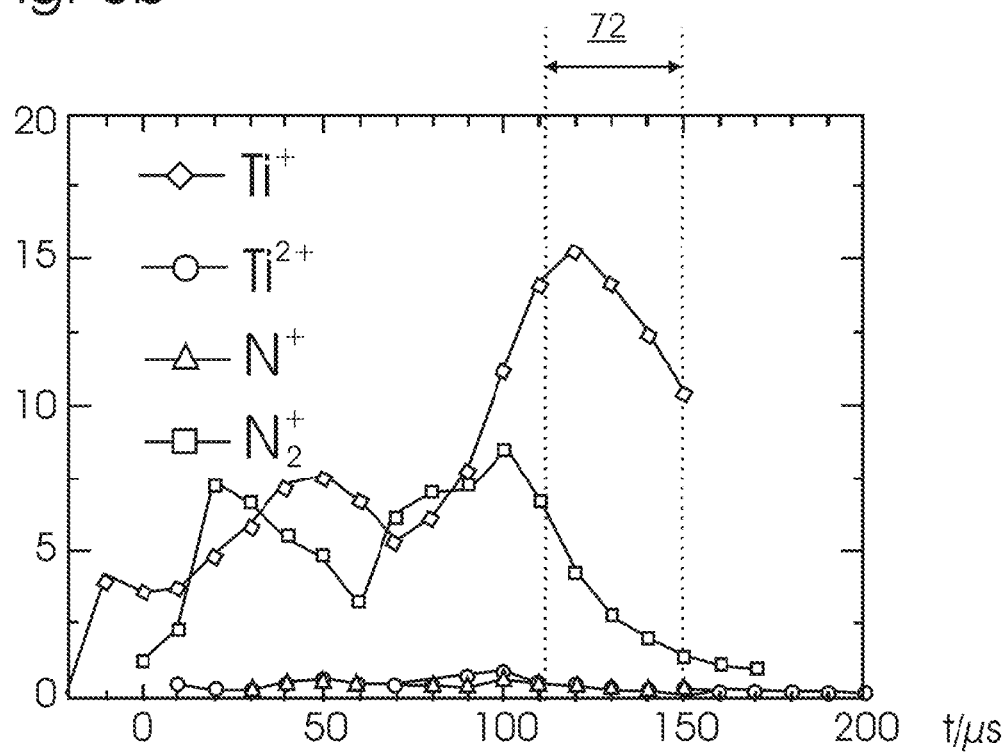

In the following, it will be demonstrated based on a first example (FIG. 6a, 6b) and a second example (FIG. 7a, 7b) how suitable synchronization of the bias pulses 66 and bias sub-pulses 68 with the cathode pulses 60 and cathode sub-pulses 62 can influence the composition of the coating 44:

In the first example, FIG. 6b shows an example of the respective temporal progression for a magnetron cathode having a target consisting of titanium and with nitrogen being supplied as the reactive gas and argon as the process gas for some types of ions formed in the plasma, after application of a cathode pulse 60 having the course shown in FIG. 6a and having two cathode sub-pulses 62 of a duration $P_1$, $P_2$ of in each case 20 μs with a cathode sub-pulse break 64 of a duration $Z_1$ of 30 μs between the cathode sub-pulses 62.

As shown, the plasma contains various species of metal and gas ions, but only the respective temporal progressions are shown for four types of ions: $Ti^+$, $Ti^{2+}$, $N_2^+$ and $N^+$. These ions exhibit different temporal progressions. For example, the $Ti^+$ metal ions exhibit a pronounced maximum at approx. 120 μs after the start of the cathode pulse 60. This is particularly remarkable, since the total duration P of the cathode pulse 60 is only 70 μs.

As shown schematically, it is possible to define a time period 72 in which the $Ti^+$ metal ions predominate.

The positive gas and metal ions of the plasma are accelerated toward the surface of the substrate 42 by means of the negative bias voltage $V_B$ and thus become part of the coating 44 depositing there. In the case of a DC bias, i.e. a continuous DC voltage as the bias voltage $V_B$, all ions are selected for the layer formation without exception. In the case of a pulsed temporal progression of the bias voltage $V_B$ that is synchronous with the temporal progression of the voltage $V_C$ at the magnetron cathodes 22a-d, as shown in FIG. 5a, 5b, a selection can be made from among the gas and metal ions present in the plasma at various points in time by suitably selecting the temporal synchronization, i.e. the delay time $T_D$ and the duration of the respective bias sub-pulses 68.

Thus, in the first example of FIG. 6a, 6b, the bias voltage $V_B$ can only be applied, for example, during the time period 72 in which $Ti^+$ ions reach a maximum. In this case, the bias voltage $V_B$ can be applied in the form of continuous bias pulses 66 which are not divided into bias sub-pulses 68.

Figure 7A:
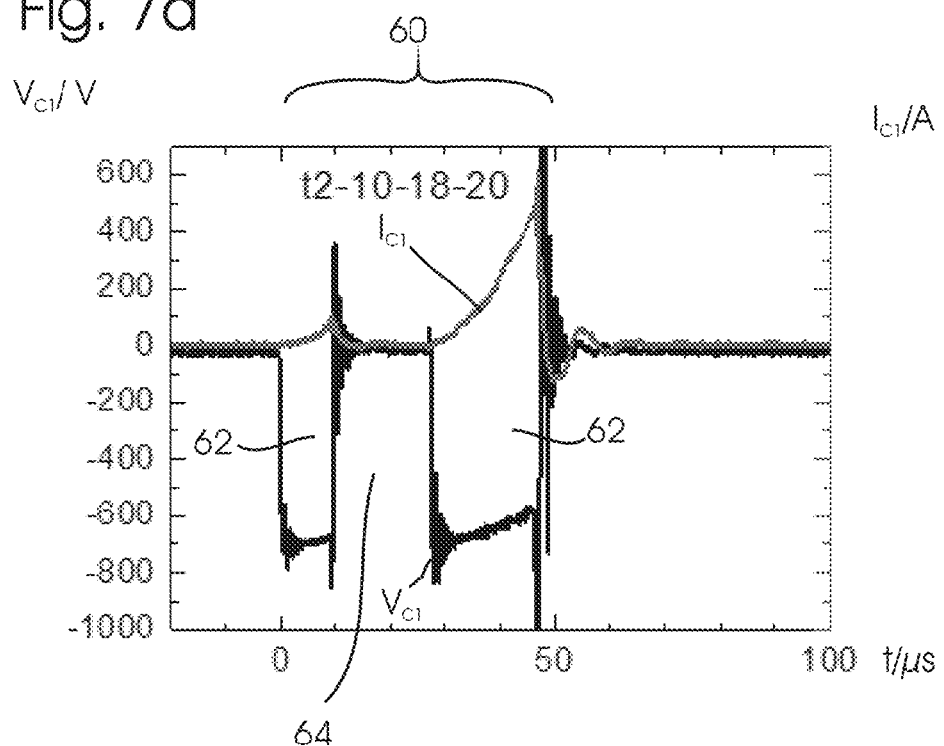
FIG. 7a, 7b show measured temporal progressions of the cathode voltage and cathode current as well as of the quantity and types of ions for a second exemplary embodiment.
Figure 7B:
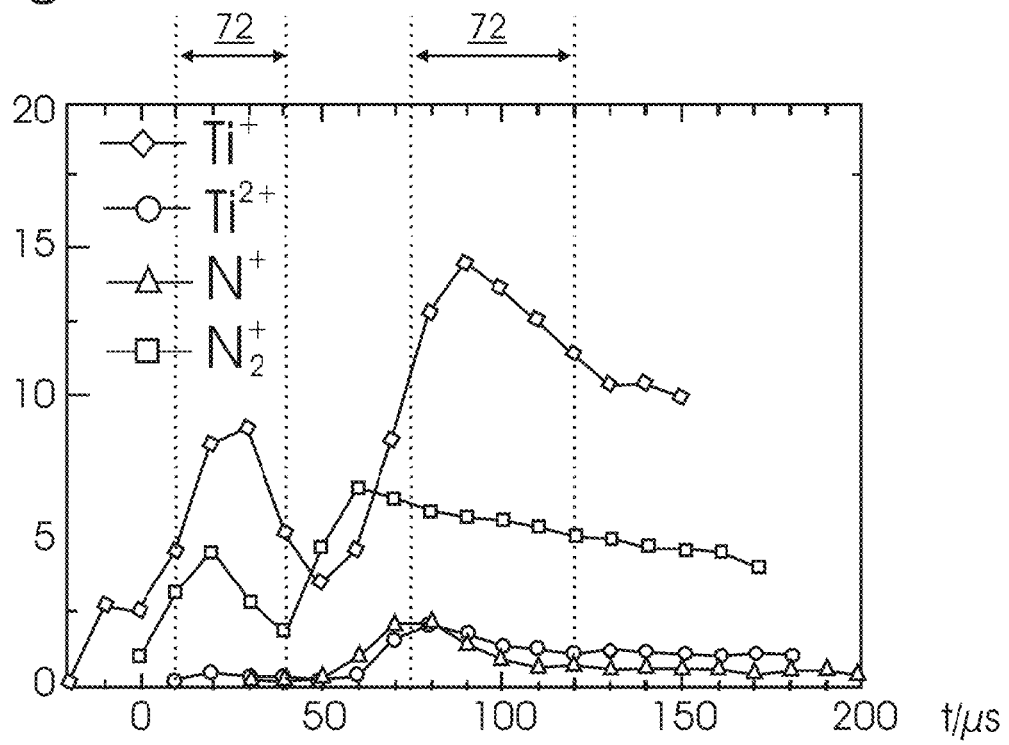

In the second example of FIG. 7a, 7b, the conditions corresponding to the representation of the first example are shown, again for a magnetron cathode 22a having a target consisting of titanium and with nitrogen being supplied as the reactive gas and argon as the process gas. As shown in FIG. 7a, the cathode pulse 60 in the second example comprises two cathode sub-pulses 62 of different durations $P_1 = 10$ μs and $P_2 = 20$ μs with a cathode sub-pulse break 64 of a duration $Z_1$ of 18 μs between the cathode sub-pulses 62.

As shown in FIG. 7b, differing temporal progressions of the various types of ions $Ti^+$, $Ti^{2+}$, $N_2^+$ and $N^+$ arise for the sequence of cathode sub-pulses 62 shown in FIG. 7a. The temporal progressions differ from the temporal progressions shown in FIG. 6b for the sequence of cathode sub-pulses 62 shown in FIG. 6a. In FIG. 7b, the $Ti^+$ ions, in particular, exhibit two maxima at approximately t=30 μs and t=90 μs with an intervening minimum at approx. t=50 μs. In this case, too, the second, higher maximum is after the end of the cathode pulse at t=48 μs.

In FIG. 7b, in deviation from the first example according to FIG. 6b, two separate time periods 72 in which the $Ti^+$ metal ions predominate can be defined.

Accordingly, in the second example of FIG. 7a, 7b, the bias voltage $V_B$ can be applied, for example, in the form of two bias sub-pulses 68 which are each applied during the time periods 72, wherein there is an intervening bias sub-pulse break 70 within the range of approx. 40-70 μs. Thus, by selecting a suitable sequence of bias sub-pulses 68 in a targeted manner, a high proportion of $Ti^+$ ions is ensured in the forming coating 44.

As a result, the composition of the coating 44 can be predefined and the layer properties significantly influenced by means of temporal synchronization (duration $B_1$, $B_2$, ... $B_n$ of the bias sub-pulses 68 as well as start time of the bias sub-pulses 68, for example each calculated from the start of the cathode pulse 60, or in the case of the assignment of cathode sub-pulses 62 and bias sub-pulses 68 by the respective delay time $T_D$). In particular in consideration of the proportion of the process gas argon in the coating 44 (the temporal progression of Ar ions not being shown in the examples of FIG. 6b, 7b, however), the properties can be suitably predefined, in particular with regard to internal stresses in the coating 44 as well as the hardness thereof. In the case of a high Ar content, a coating 44 having high internal stresses and high hardness is produced. A coating 44 having a lower Ar content is therefore rather ductile and has significantly lower internal stresses.

In the following, further examples of pulse sequences for cathode pulses 60 or rather sequences of cathode sub-pulses 62 are presented and explained.

In the third example (FIG. 8a, 8b) and in the fourth example (FIG. 9a, 9b), four magnetron cathodes 22a, 22b, 22c, 22d are operated in the HIPIMS method at a frequency of 2 kHz, i.e. at T=500 μs. The electrical power averaged over time is in each case 12 kW per cathode, i.e. 48 kW in total. The magnetron cathodes 22a-d are equipped with targets 24a-d of titanium, aluminum, and silicon, for example two titanium-silicon targets and two titanium-aluminum targets. Argon is admitted as the process gas and nitrogen as the reactive gas.

The layer 44 deposited on indexable inserts as the substrate 40 is in each case an Al—Ti—Si—N layer.

Figure 8A:
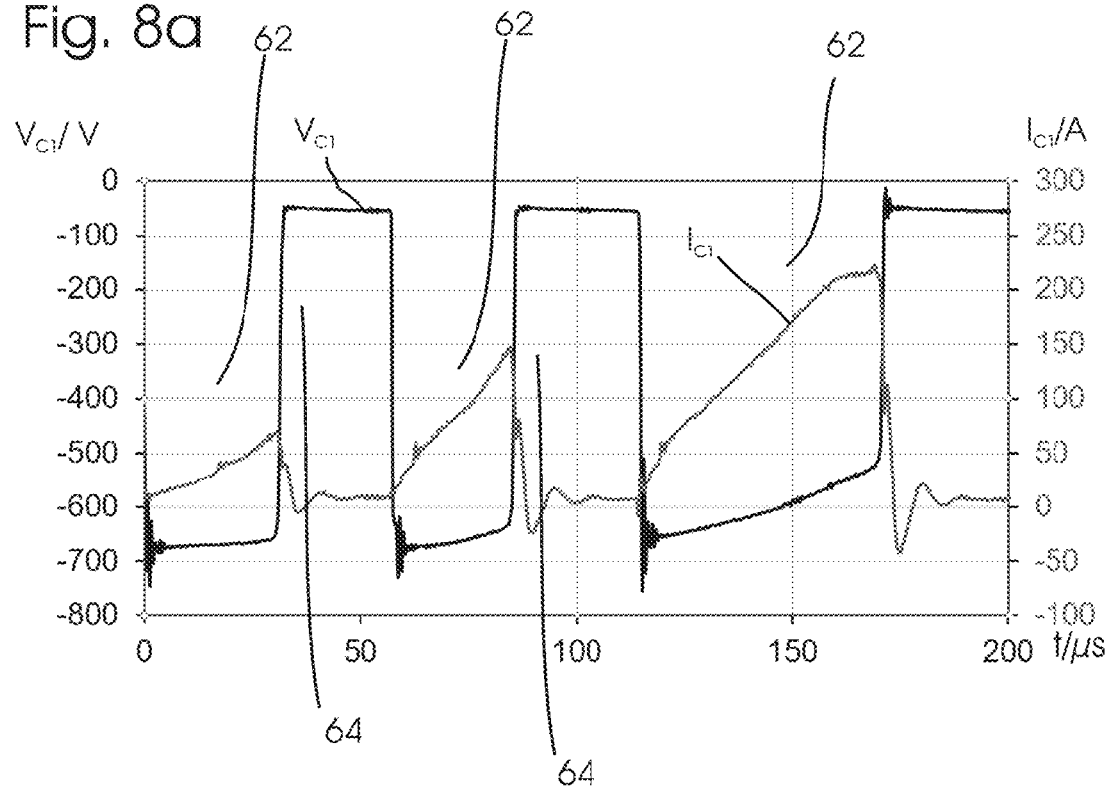
FIG. 8a, 8b show measured temporal progressions of the cathode voltage and cathode current as well as of the bias voltage and bias current according to a third exemplary embodiment.
Figure 8B:
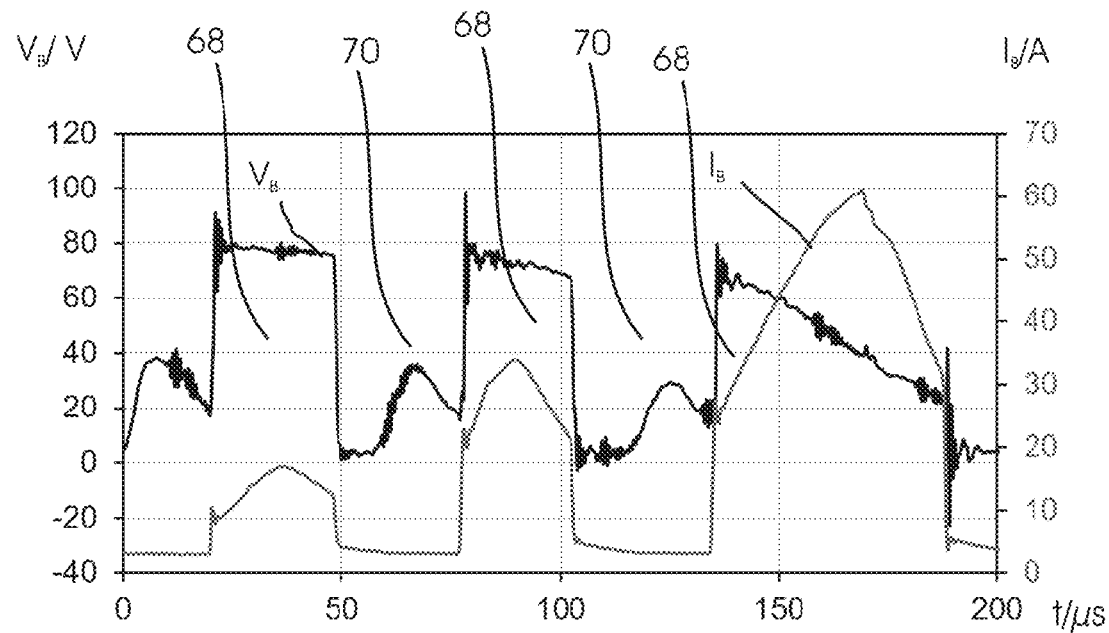
Figure 9A:
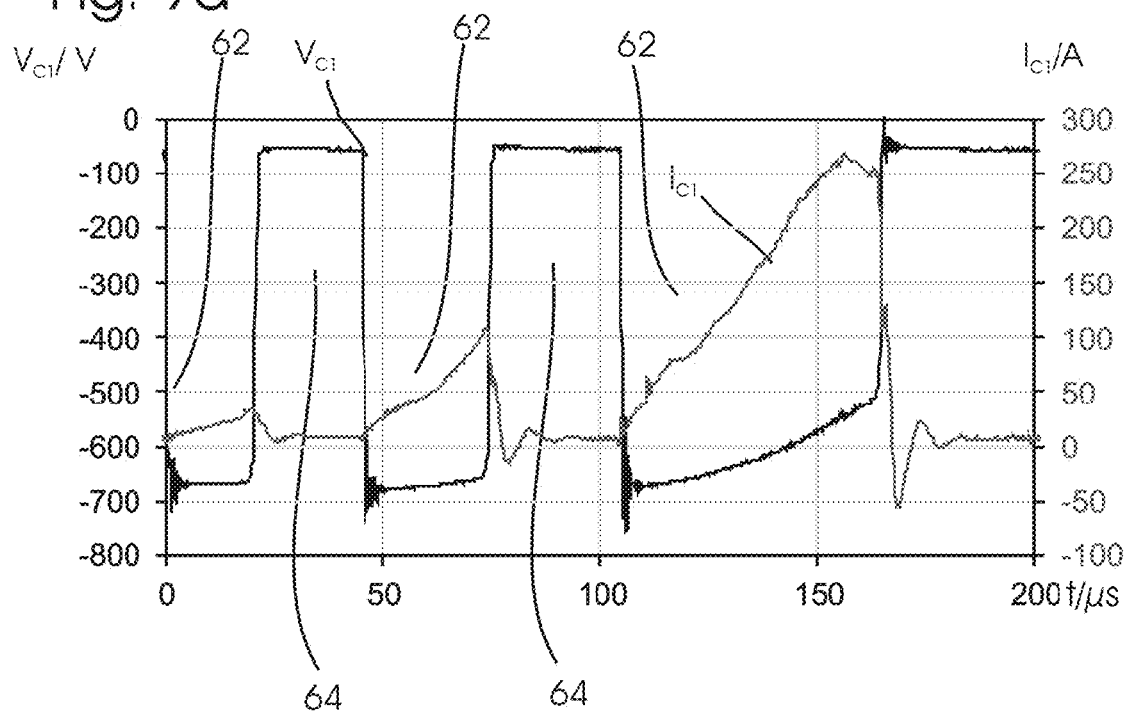
FIG. 9a, 9b show measured temporal progressions of the cathode voltage and cathode current as well as of the bias voltage and bias current according to a fourth exemplary embodiment.
Figure 9B:
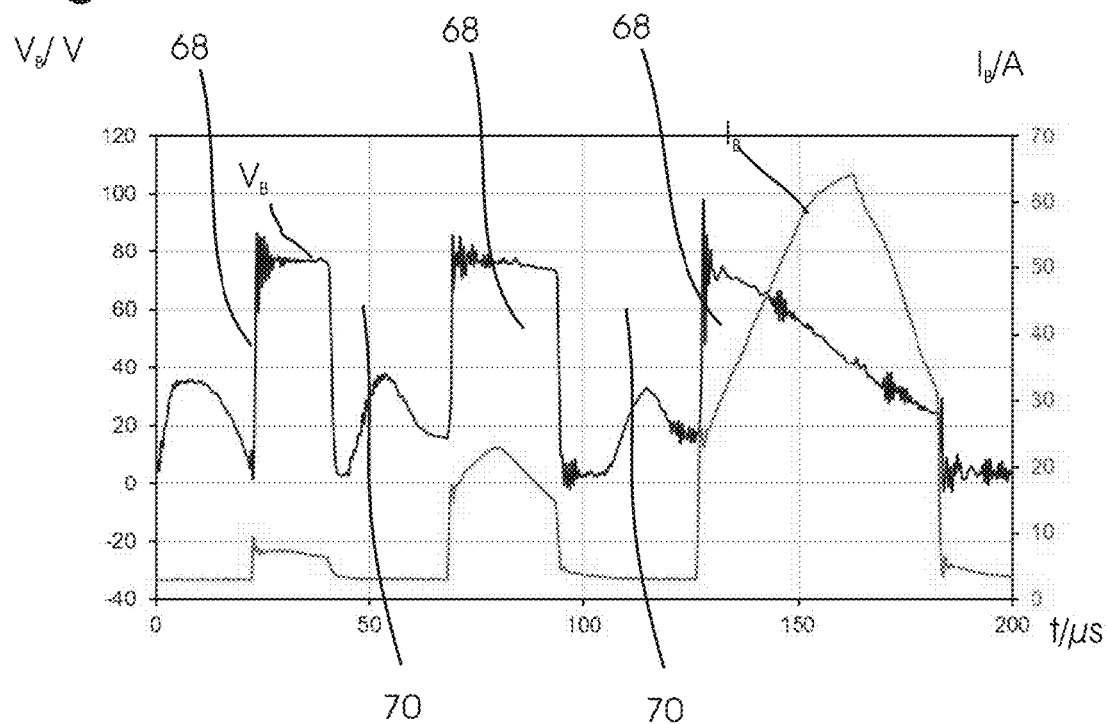

The third and fourth example differ on account of different sequences of cathode sub-pulses 62 (FIG. 8a, 9a) as well as different sequences of bias sub-pulses 68 (FIG. 8b, 9b).

In the third example, the sequence of the cathode sub-pulses 62 comprises three cathode sub-pulses 62, the third of which is longer than the first two. The respective durations of the cathode sub-pulses 62 and cathode sub-pulse breaks 64 are $P_1$=30 μs,
$P_2$=25 μs,
$P_3$=60 μs,
$Z_1$=25 μs,
$Z_2$=30 μs, which produces a total pulse length P of 170 μs within the period duration T of 500 μs.

The pulse shape of the cathode sub-pulses 62 is in each case substantially rectangular with a voltage $V_C$, of approx. 680 V, which drops slightly in the course of the pulses, however a drop of approx. 20% in the voltage takes place in the third cathode sub-pulse 62, which is nevertheless considered to be substantially a rectangular shape.

As shown, the cathode current $I_{C1}$ increases in each case in a ramp-like manner, during the first cathode sub-pulse 62 to approx. 75 A, during the second cathode sub-pulse 62 to approx. 145 A, and during the third cathode sub-pulse 62 to a peak value of approx. 220 A. It therefore proves advantageous that the third cathode sub-pulse 62 is significantly longer than the first and second cathode sub-pulse 62, such that the peak power reached is approx. 120 kW in this case.

As shown in FIG. 8b, the associated sequence of the bias voltage $V_B$ comprises three bias sub-pulses 68, the time durations of which substantially corresponds to those of the respectively associated cathode sub-pulses 62, which are, however, applied with a delay time $T_D$ of approx. 20 μs.

The resulting bias current $I_B$ reaches a peak value of approx. 15 A during the first bias sub-pulse 68, a peak value of approx. 33 A during the second bias sub-pulse 68, and a peak value of over 60 A during the third, longest bias sub-pulse 68, which shows that a large number of ions is accelerated toward the substrate 42.

In the third example, the coating 44 grows at a deposition rate of 1.9 μm/h.

As a measure of ionization, the proportion of ionized titanium atoms relative to the quantity of non-ionized titanium atoms in the plasma can be measured by means of OES. In the third example, very high ionization results for $Ti^+$/Ti with a ratio of approx. 1.2. A comparative example with undivided HIPIMS pulses under otherwise identical conditions only achieves a ratio of 0.93.

In the fourth example, as in the third example, the sequence of the cathode sub-pulses 62 also comprises three cathode sub-pulses 62, the first of which is even shorter than in the third example and the third of which is even longer, thus producing a sequence of increasing cathode sub-pulse durations:

$P_1$=20 μs,
$P_2$=25 μs,
$P_3$=70 μs,
$Z_1$=25 μs,
$Z_2$=30 μs.

In this case, too, the pulse length P totals 170 μs. As in the third example, the pulse shapes are substantially rectangular (with a somewhat more significant drop during the third cathode sub-pulse 62). The cathode current $I_{C1}$, which increases in a ramp-like manner in each case, only reaches approx. 25 A during the first cathode sub-pulse 62, approx. 100 A during the second cathode sub-pulse 62, and approx. 215 A during the third cathode sub-pulse 62. Compared with the third example, an even higher peak power of almost 130 kW is achieved.

In the fourth example (FIG. 9b), too, the bias voltage $V_B$ also comprises three bias sub-pulses 68, wherein the time durations of bias sub-pulses 68 and cathode sub-pulses 62 as well as bias sub-pulse breaks 70 and cathode sub-pulse breaks 64 likewise substantially correspond to one another, however the bias sub-pulses 68 are delayed with a delay time $T_D$ of approx. 25 μs. The bias current $I_B$ reaches a peak value of merely approx. 5 A during the first bias sub-pulse 68, a peak value of approx. 25 A during the second bias sub-pulse 68, and a peak value of approx. 65 A during the third bias sub-pulse 68. The deposition rate is also 1.9 μm/h, as in the third example.

In the fourth example, a $Ti^+$/Ti ratio of 1.57 and thus increased ionization compared with the third example results.

Figure 13A:
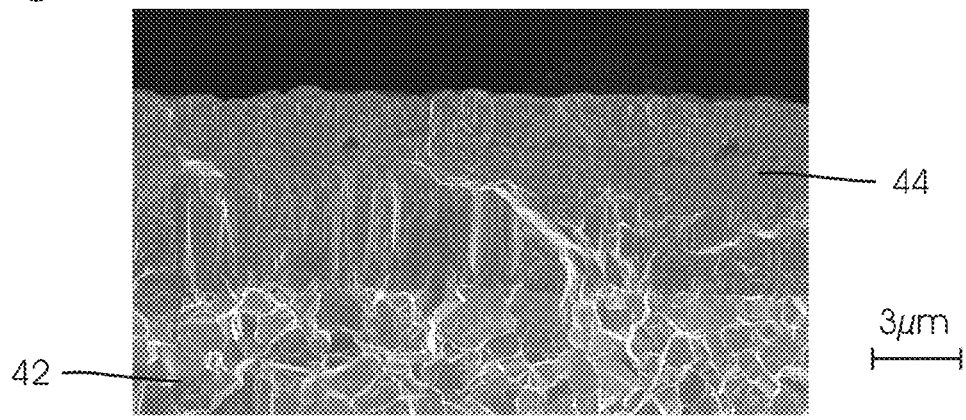
FIG. 13a, 13b show SEM photos of the fracture morphology of a coating on a free face and on a rake face of a body according to a comparative example.
Figure 13B:
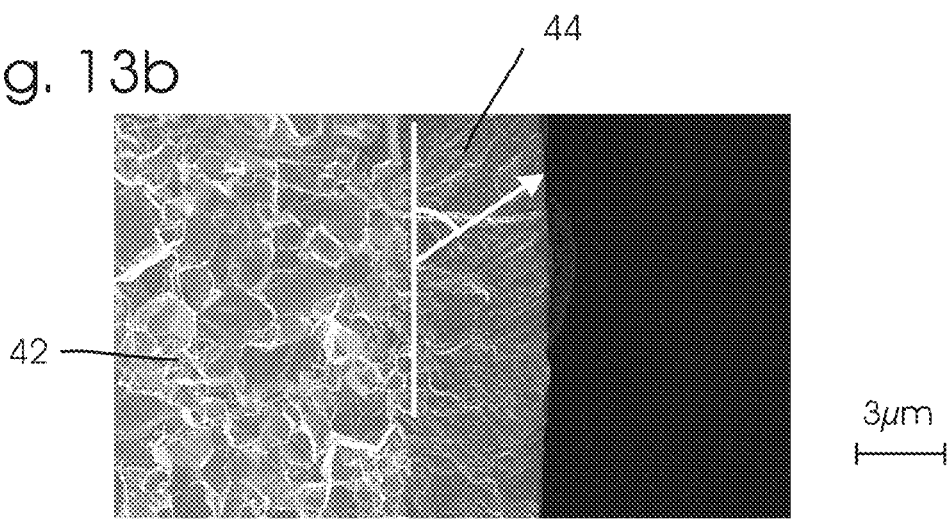
Figure 14A:
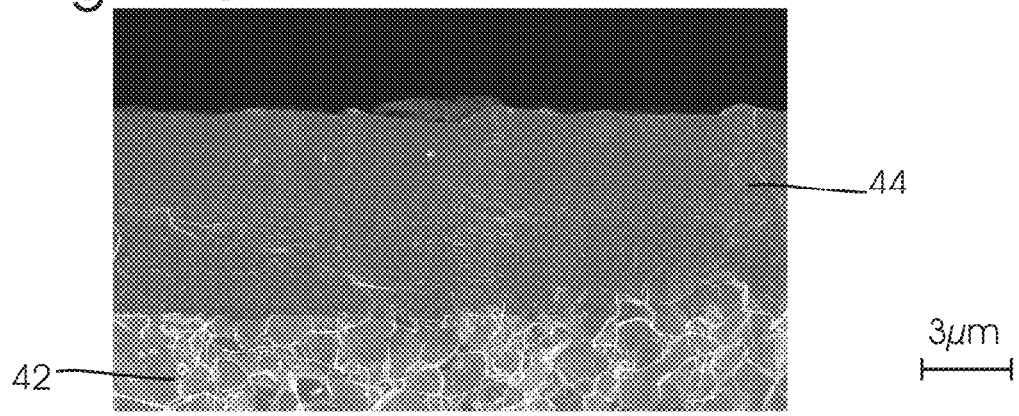
FIG. 14a, 14b show SEM photos of the fracture morphology of a coating on a free face and on a rake face of a body according to an exemplary embodiment.
Figure 14B:
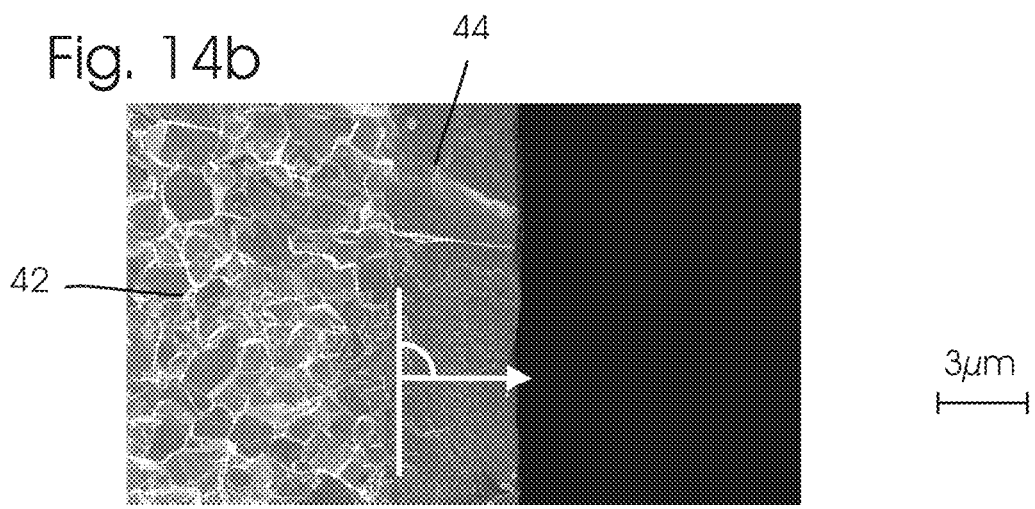

The coating 44 produced in this manner on the substrate material 42 is shown in FIG. 14a, 14b in comparison to a coating 44 (FIG. 13a, 13b) according to a comparative example with an undivided HIPIMS pulse, but with otherwise identical conditions. The coatings 44 are shown in each case on a free face 52, which, as sketched in FIG. 12, is oriented toward the target 24a during operation of the coating system 10, and on a rake face 54, which is arranged orthogonally hereto.

FIG. 4a shows the coating 44 on the free face 52 of the body 40, produced by means of the special chopped HIPIMS method with the sequence of cathode sub-pulses 62 according to FIG. 9a, 9b. The coating 44 exhibits a much finer structure relative to the comparative example shown in FIG. 13a.

Figure 12:
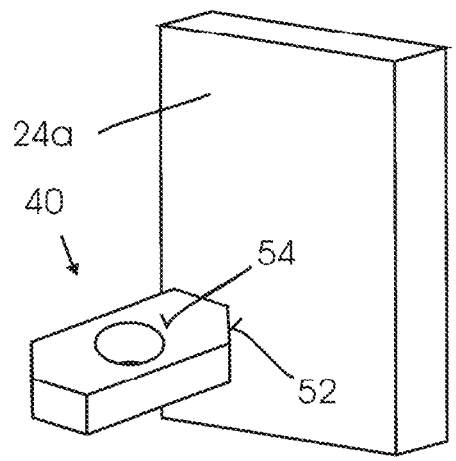
FIG. 12 is a schematic representation of the orientation of a body to be coated with respect to a target of a cathode.

As is visible from FIG. 14b, the coating 44 also exhibits a much finer structure than in the comparative example (FIG. 13b) on the rake face 54, which is not oriented toward the target 24b (FIG. 12). It can also be seen that, in the comparative example according to FIG. 13b, the coating 44 has an oblique direction of growth, shown here by way of example by a white arrow, which is not oriented orthogonally to the substrate surface, but rather obliquely toward the target 24b, whereas no such oblique direction of growth can be discerned from FIG. 14b based on the example of the chopped HIPIMS method with a special sequence of cathode sub-pulses 62 according to FIG. 9a, 9b, and instead the coating 44 visibly grows orthogonally to the substrate surface.

It is assumed that this more uniform growth and the finer structure are the result of the higher degree of ionization.

The coatings 44 created according to the fourth exemplary embodiment exhibit particularly favorable properties on a coated tool, in particular. In machining tests with indexable inserts which were coated on one side according to the above-mentioned comparative example (continuous, undivided HIPIMS pulses) and on the other side using the sequence of cathode sub-pulses 62 and bias sub-pulses 68 according to the fourth example above, a 20% longer tool life during machining of X6CrNiMoTi17-12-2 compared to the comparative example was achieved for the fourth example with a coating 44 measuring 6 μm in each case.

In the following, further examples of sequences of cathode sub-pulses 62 and bias sub-pulses 68 are presented.

Figure 10A:
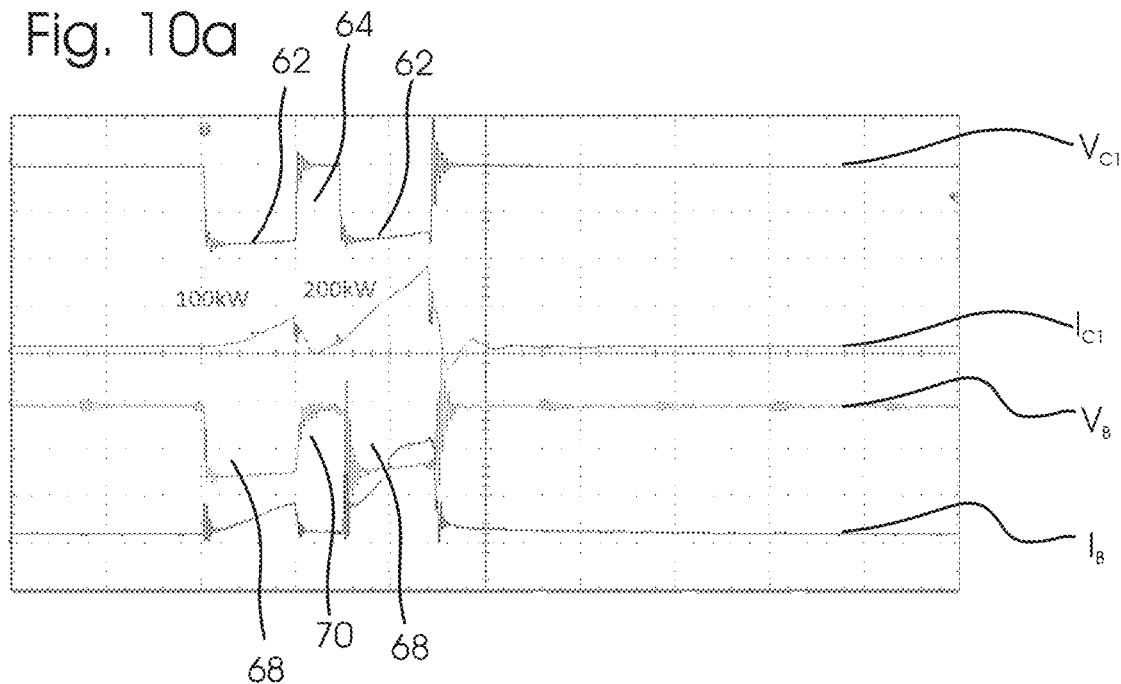
FIG. 10a, 10b show graphs of measured temporal progressions of electrical variables according to a fifth and sixth example.
Figure 10B:
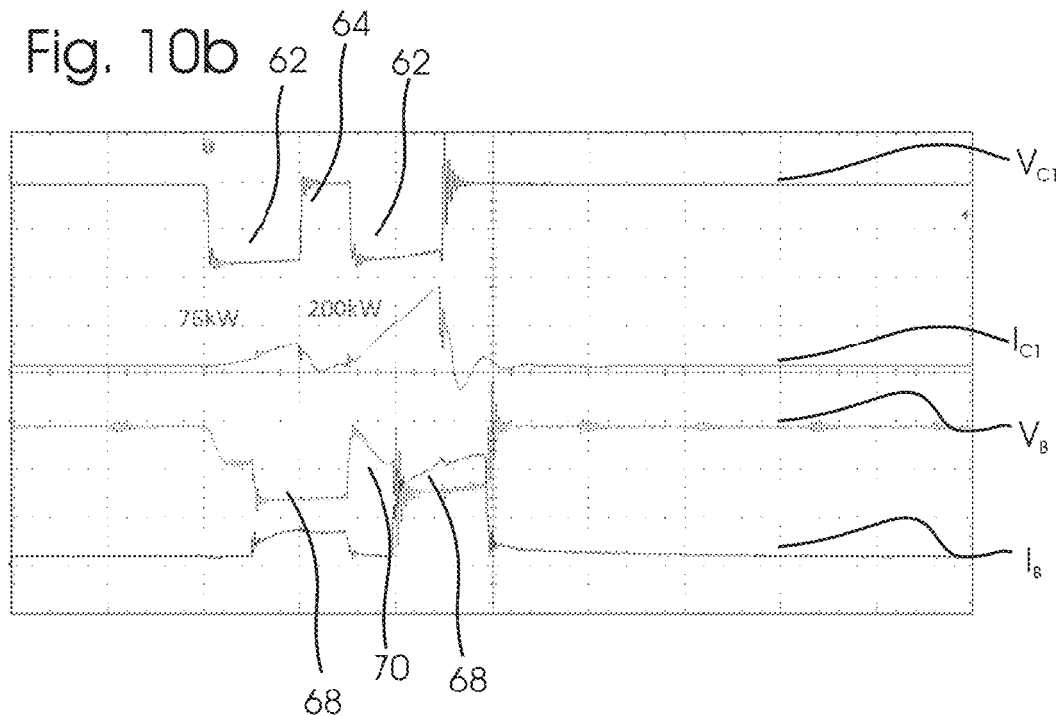

Firstly, various types of synchronization of the temporal progression of the bias voltage $V_B$ are set out in a comparison of a fifth example according to FIG. 10a and a sixth example according to FIG. 10b. In both examples, the bias voltage $V_B$ is divided into bias sub-pulses 68 that are synchronous with the cathode sub-pulses 62. However, in the fifth example (FIG. 10a), the synchronization is without a delay time ($T_D$=0 μs), whereas in the sixth example (FIG. 10b) a delay time is provided ($T_D$=10 μs): FIG. 10a shows a measured progression of the voltage $V_{C1}$ at the first magnetron cathode 22a, of the current $I_{C1}$ to the first magnetron cathode 22a, of the bias voltage $V_B$, and of the bias current $I_B$ for a sequence of two successive cathode sub-pulses 62 with an intermediate cathode sub-pulse break 64.

The frequency is 1000 Hz (T=1 ms). The pulse durations of the cathode sub-pulses 62 and cathode sub-pulse break 64 are P=20 s, $P_2$=20 μs, $Z_1$=1 μs. The pulse duration of the cathode pulse 60 is 50 μs (corresponds to 5% of the period duration T). The bias voltage $V_B$ is periodic with the same frequency and comprises two bias sub-pulses 66 and a bias sub-pulse break 70 with $B_1$=20 μs, $B_2$=20 μs, $Z_{B1}$=10 μs, which are temporally synchronous with the cathode sub-pulses 62 having the same duration and without a delay ($T_D$=0 μs).

In the example of FIG. 10a, the charging device 46 of the HIPIMS power supply 26a is regulated at constant power of 3000 W. The capacitor 48 of the HIPIMS power supply 26a is charged to approx. 700 V at the start of the first cathode sub-pulse 62. As shown, the cathode sub-pulses 62 have a substantially rectangular shape with little overshoot and a slight drop in the voltage $V_{C1}$ throughout the duration of the cathode sub-pulses 62.

The cathode current $I_{C1}$ exhibits a progression that rises slightly to a peak value of approx. 150 A during the first cathode sub-pulse 62, during the second cathode sub-pulse 62 a progression that rises much more steeply to a peak value of approx. 300 A. Thus, in the first cathode sub-pulse 62, a peak value of the power (peak power) of approx. 100 kW is reached, in the second cathode sub-pulse 62 a peak power of approx. 200 kW. This results in a high degree of ionization of the plasma and thus, in particular during the second bias sub-pulse 62, a large number of charge carriers of the plasma that strike the substrate 40, which can be derived from the steeply increasing bias current $I_B$.

The example of FIG. 10a thus shows a fifth exemplary embodiment with cathode sub-pulses 62 of the same length and precisely (without a delay) synchronized bias voltage $V_B$ of the same pulse sequence. The relatively high peak power achieved and the steep increase in the currents $I_{C1}$ and $I_B$ during the second sub-pulses 62, 68 are demonstrated here.

For comparison with FIG. 10a, FIG. 10b shows as a sixth exemplary embodiment a delay time $T_D$ of 10 μs between the start of the respective cathode sub-pulses 62 and bias sub-pulses 68 with otherwise identical parameters. A different progression of the bias current $I_B$ can be seen, which increases at a faster rate during the respective bias sub-pulses 68, since more ions are already available.

In the following, various sequences of cathode sub-pulses 62 are presented in a comparison of a seventh example according to FIG. 11a and an eighth example according to FIG. 11b. In both examples, sequences of five cathode sub-pulses 62 are applied in each case. However, in the seventh example (FIG. 11a), the first cathode sub-pulses 62 in terms of time are shorter than the later cathode sub-pulses 62, whereas the earlier cathode sub-pulses 62 are longer than the later cathode sub-pulses 62 in the eighth example (FIG. 11b).

The two examples are characterized by the following parameters:

|  | Example 7 (FIG. 11a) | Example 8 (FIG. 11b) |
| --- | --- | --- |
| Frequency | f = 1000 Hz (T = 1 ms) | f = 1000 Hz (T = 1 ms) |
| Power of charging device 46 | 6 kW | 6 kW |
| Pulse duration of cathode pulse 60 | 120 μs (12% of T) | 120 μs (12% of T) |
| Number of cathode sub-pulses 62 | 5 | 5 |
| Sequence of cathode sub-pulses 62 | $P_1$ = 10 μs<br>$P_2$ = 10 μs<br>$P_3$ = 20 μs<br>$P_4$ = 20 μs<br>$P_5$ = 20 μs | $P_1$ = 20 μs<br>$P_2$ = 20 μs<br>$P_3$ = 20 μs<br>$P_4$ = 10 μs<br>$P_5$ = 10 μs |
| Sequence of cathode sub-pulse breaks 64 | $Z_1$ = 10 μs<br>$Z_2$ = 10 μs<br>$Z_3$ = 10 μs<br>$Z_4$ = 10 μs | $Z_1$ = 10 μs<br>$Z_2$ = 10 μs<br>$Z_3$ = 10 μs<br>$Z_4$ = 10 μs |

In FIG. 8a, 8b, the bias voltage $V_B$ is in each case periodic with the same frequency and a pulse sequence and temporally synchronous with the cathode sub-pulses 62 with the same duration and without a delay time ($T_D$=0 μs).

Figure 11A:
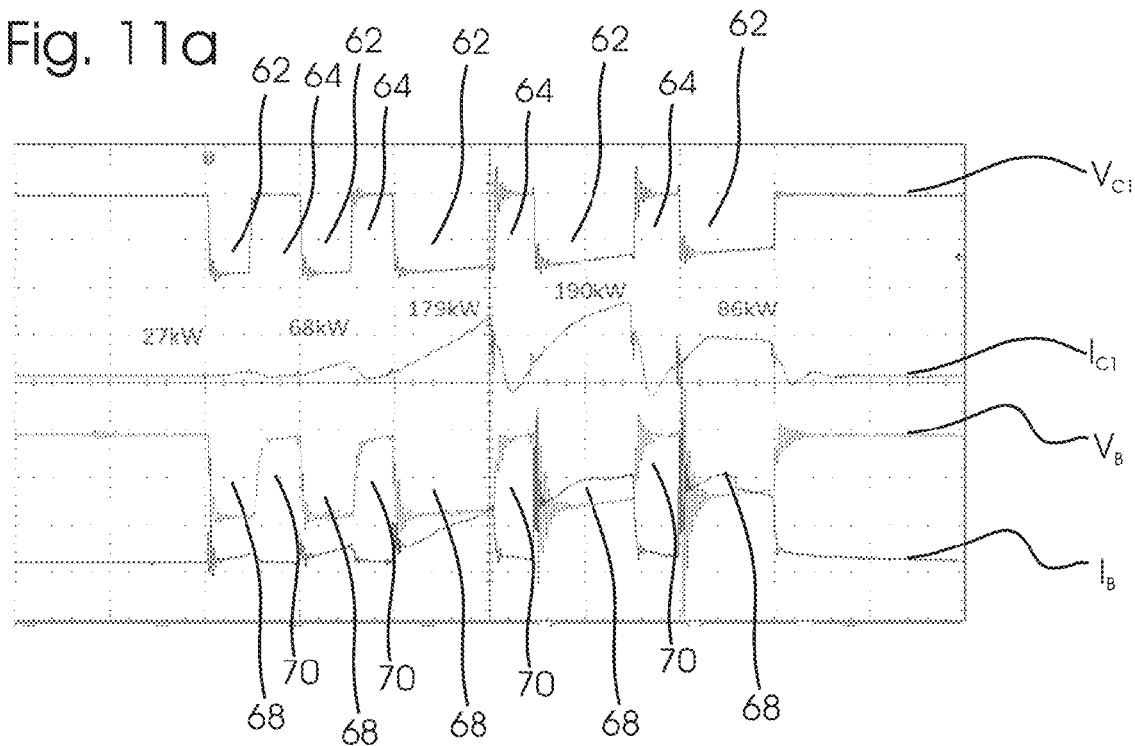
FIG. 11a, 11b show graphs of measured temporal progressions of electrical variables according to a seventh and eighth example.
Figure 11B:
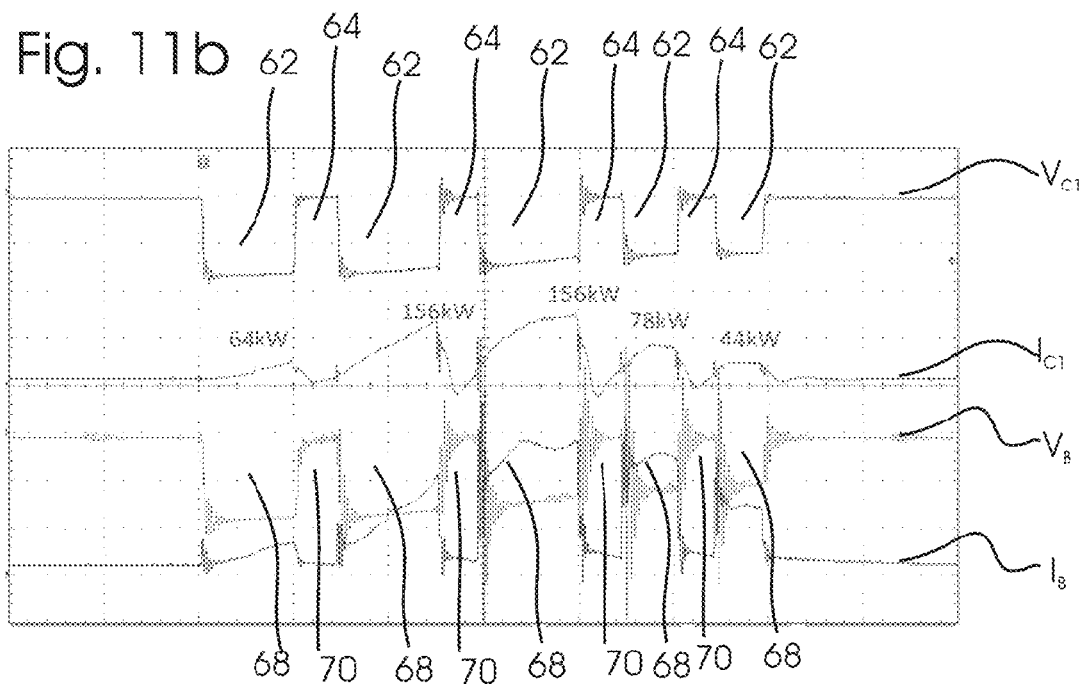

In the example of FIG. 11a, only low peak powers of 27 kW and 68 kW are initially produced during the first two cathode sub-pulses 62. During the subsequent longer cathode sub-pulses 62, however, the peak powers then rise sharply to 179 kW and 190 kW, after which only 86 kW is reached during the last cathode sub-pulse 62.

In the example of FIG. 11b, the peak power only increases during the first three cathode sub-pulses 62 with values of 64 kW and 156 kW, whereas the peak power is less in subsequent cathode sub-pulses. Therefore, overall, lower values for the peak power are achieved than in the example of FIG. 11a.

As a result, sequences with initially shorter cathode sub-pulses 62 and longer subsequent cathode sub-pulses 62 have proven favorable.

The invention claimed is:

1. A HIPIMS coating method for coating a body, wherein the body is arranged in a vacuum chamber, wherein at least one magnetron cathode having a target is arranged in the vacuum chamber, electrical power is supplied in a periodic waveform to the magnetron cathode such that a plasma is generated and the target is sputtered in order to deposit a coating on the body, wherein, within a period duration of the periodic waveform, the electrical power is supplied in at least two cathode sub-pulses with an intervening cathode sub-pulse break, wherein the period duration is at most 1.5 ms, and bias voltage is applied, within the period duration, to the body with at least two bias sub-pulses with an intervening bias sub-pulse break, wherein the period duration is defined as a period from a start of a first of the at least two cathode sub-pulses to a start of a first of a succeeding at least two cathode sub-pulses.

2. The coating method according to claim 1, wherein at least one of the bias sub-pulses starts with a delay time after the start of one of the cathode sub-pulses.

3. The coating method according to claim 1, wherein the number of bias sub-pulses is less than the number of cathode sub-pulses.

4. The coating method according to claim 1, wherein metal ions are formed in the plasma by means of the cathode sub-pulses, wherein the quantity of metal ions of one type has a temporal progression from the start of a first of the cathode sub-pluses that has at least one maximum, and wherein at least one bias sub-pulse is applied during the maximum.

5. The coating method according to claim 1, wherein the cathode sub-pulses comprise at least a first and a second cathode sub-pulse, wherein the first and the second cathode sub-pulse differ in terms of their duration and wherein the first and the second cathode sub-pulse each last for at least 8 µs.

6. The coating method according to claim 5, wherein the first cathode sub-pulse is the first cathode sub-pulse in time, and wherein the first cathode sub-pulse is shorter than the second cathode sub-pulse.

7. The coating method according to claim 6, wherein the second cathode sub-pulse lasts for at least 15 µs.

8. The coating method according to claim 6, wherein the first cathode sub-pulse lasts for at most 25 µs.

9. The coating method according to claim 5, wherein a third cathode sub-pulse temporally follows the first and the second cathode sub-pulse, wherein the third cathode sub-pulse lasts at least as long as the first and at least as long as the second cathode sub-pulse.

10. The coating method according to claim 1, wherein a sequence of cathode sub-pulses lasts for less than half of the period duration.

11. The coating method according to claim 1, wherein the cathode power supply comprises a charged capacitor and a charging device therefor, such that the electrical power supplied to the magnetron cathode is provided from the charged capacitor.

12. The coating method according to claim 11, wherein the charging device is regulated at constant power.

13. The coating method according to claim 1, wherein the cathode sub-pulses are voltage pulses, and at least one of the cathode sub-pulses has a peak value of 600 V to 1200 V.

14. The coating method according to claim 1, wherein at least one of the cathode sub-pulses is an at least substantially rectangular pulse or at least has a trapezoidal progression.

15. The coating method according to claim 1, wherein the peak power of at least one of the cathode sub-pulses reaches at least 50 kW.

16. The coating method according to claim 1, wherein the cathode sub-pulses comprise at least a first and a second cathode sub-pulse, wherein the second cathode sub-pulse temporally follows the first cathode sub-pulse, and wherein a peak value of electrical power supplied to the magnetron cathode during the second cathode sub-pulse is at least 30% higher than during the first cathode sub-pulse.

17. The coating method according to claim 1, wherein the target comprises materials chosen from groups 4 to 6 of the periodic table, boron, carbon, silicon, yttrium, and/or aluminum.

18. The coating method according to claim 2, wherein all bias sub-pulses start with a respective delay time after the start of associated cathode sub-pulses.

19. The coating method according to claim 18, wherein the delay times of the bias sub-pulses to the respective associated cathode sub-pulses are equal.

20. The coating method according to claim 18, wherein the delay times of the bias sub-pulses to the respective associated cathode sub-pulses differ from one another.

21. The coating method according to claim 7, wherein the second cathode sub-pulse lasts for at least 20 µs.

22. The coating method according to claim 21, wherein the second cathode sub-pulse lasts for at least 25 µs.

23. The coating method according to claim 8, wherein the first cathode sub-pulse lasts for at most 20 µs.

24. The coating method according to claim 23, wherein the first cathode sub-pulse lasts for at most 15 µs.

25. The coating method according to claim 10, wherein a sequence of cathode sub-pulses lasts at most for one third of the period duration.

26. A HIPIMS coating device for coating a body, comprising a vacuum chamber having a receiving means for the body and at least one magnetron cathode with a target, a cathode power supply for supplying electrical power to the magnetron cathode in a periodic waveform in order to generate a plasma and sputter the target, a control device which is designed for controlling the cathode power supply in order to supply, within a period duration of the periodic waveform, electrical power to the magnetron cathode in at least two cathode sub-pulses with an intervening cathode sub-pulse break, wherein the period duration is at most 1.5 ms, and a bias power supply for supplying electrical power to the body, wherein the control device is further designed for controlling the bias power supply such that bias voltage is applied, within a period duration, with at least two bias sub-pulses with an intervening bias sub-pulse break, wherein the period duration is defined as a period from a start of a first of the at least two cathode sub-pulses to a start of a first of a succeeding at least two cathode sub-pulses.

27. The coating device according to claim 26, wherein
the cathode sub-pulses comprise at least one first and one second cathode sub-pulse, wherein the first and the second cathode sub-pulse differ in terms of their duration and wherein the first and the second cathode sub-pulse each last for at least 8 µs.

28. The sensor device according to claim 26, wherein
the period duration is at most 1.5 ms.

29. The coating device according to claim 26, wherein
the cathode power supply comprises a charged capacitor and a charging device therefor, such that the electrical power supplied to the magnetron cathode is provided from the charged capacitor.

30. A HIPIMS coating method for coating a body, wherein
the body is arranged in a vacuum chamber, wherein at least one magnetron cathode having a target is arranged in the vacuum chamber, electrical power is supplied to the magnetron cathode such that a plasma is generated and the target is sputtered in order to deposit a coating on the body, wherein, within a period duration, the electrical power is supplied in at least two cathode sub-pulses with an intervening cathode sub-pulse break, and bias voltage is applied, within the period duration, to the body with at least two bias sub-pulses with an intervening bias sub-pulse break, wherein the period duration is defined as a period from a start of a first of the at least two cathode sub-pulses to a start of a first of a succeeding at least two cathode sub-pulses, wherein the number of bias sub-pulses is less than the number of cathode sub-pulses.

* * * * *